(12) United States Patent
Park

(10) Patent No.: US 10,651,265 B2
(45) Date of Patent: May 12, 2020

(54) ORGANIC LIGHT EMITTING DISPLAY DEVICE

(71) Applicant: Samsung Display Co., Ltd., Yongin-si, Gyeonggi-Do (KR)

(72) Inventor: Gyung-Soon Park, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/410,352

(22) Filed: Jan. 19, 2017

(65) Prior Publication Data

US 2017/0221982 A1    Aug. 3, 2017

(30) Foreign Application Priority Data

Feb. 2, 2016    (KR) .................. 10-2016-0012867

(51) Int. Cl.
  *H01L 27/32*    (2006.01)
  *H01L 51/52*    (2006.01)
  *H01L 51/00*    (2006.01)

(52) U.S. Cl.
  CPC ...... *H01L 27/3293* (2013.01); *H01L 27/3246* (2013.01); *H01L 51/0096* (2013.01); *H01L 51/5256* (2013.01); *H01L 51/5271* (2013.01)

(58) Field of Classification Search
  CPC ............. H01L 27/3293; H01L 27/3246; H01L 27/3258; H01L 27/3272; H01L 51/0095; H01L 51/5271; H01L 51/0097; H01L 51/5256; H01L 51/5253; H01L 2227/323; H01L 2251/5338; Y02E 10/549
  See application file for complete search history.

(56) References Cited

U.S. PATENT DOCUMENTS

| 8,729,524 | B2 | 5/2014 | Rogers et al. |
| 8,933,443 | B2 | 1/2015 | Yim et al. |
| 9,099,676 | B2 | 8/2015 | Kuo et al. |
| 9,190,630 | B2 | 11/2015 | Kim et al. |
| 9,704,930 | B2 | 7/2017 | Wang et al. |
| 10,276,831 | B2 | 4/2019 | Lee et al. |
| 2008/0218369 | A1 | 9/2008 | Krans et al. |

(Continued)

FOREIGN PATENT DOCUMENTS

| CN | 101185175 A | 5/2008 |
| CN | 102437172 A | 5/2012 |

(Continued)

OTHER PUBLICATIONS

Chinese Office Action Report, Application No. 201710063538.0 dated Feb. 3, 2020, 12 pages.

*Primary Examiner* — Vongsavanh Sengdara
(74) *Attorney, Agent, or Firm* — Innovation Counsel LLP

(57) ABSTRACT

An organic light emitting display device includes substrates, connection substrates, sub-pixel structures, a thin film encapsulation structure, and a reflection pattern. The substrates each has a pixel region, and is spaced apart from each other. The pixel region includes sub-pixel regions and reflective region surrounding the sub-pixel regions. The connection substrates connect adjacent substrates among the substrates. The sub-pixel structures are disposed in the sub-pixel regions on the substrates each. The thin film encapsulation structure is disposed on the sub-pixel structures. The reflection pattern is disposed in the reflective region on the thin film encapsulation structure.

20 Claims, 23 Drawing Sheets

(56) References Cited

U.S. PATENT DOCUMENTS

| | | | |
|---|---|---|---|
| 2013/0041235 A1 | 2/2013 | Rogers et al. | |
| 2014/0061595 A1* | 3/2014 | Kim | H01L 27/3244 |
| | | | 257/40 |
| 2014/0291637 A1* | 10/2014 | Yim | H01L 51/5253 |
| | | | 257/40 |
| 2015/0194625 A1* | 7/2015 | Kim | H01L 27/3223 |
| | | | 257/40 |
| 2015/0333112 A1* | 11/2015 | Kamimura | H01L 51/56 |
| | | | 257/40 |
| 2016/0124557 A1* | 5/2016 | Choi | G06F 3/0412 |
| | | | 345/173 |
| 2017/0097545 A1 | 4/2017 | Yim et al. | |

FOREIGN PATENT DOCUMENTS

| | | |
|---|---|---|
| CN | 103811530 A | 5/2014 |
| CN | 103855191 A | 6/2014 |
| CN | 103996696 A | 8/2014 |
| CN | 104103661 A | 10/2014 |
| CN | 105280677 A | 1/2016 |

\* cited by examiner

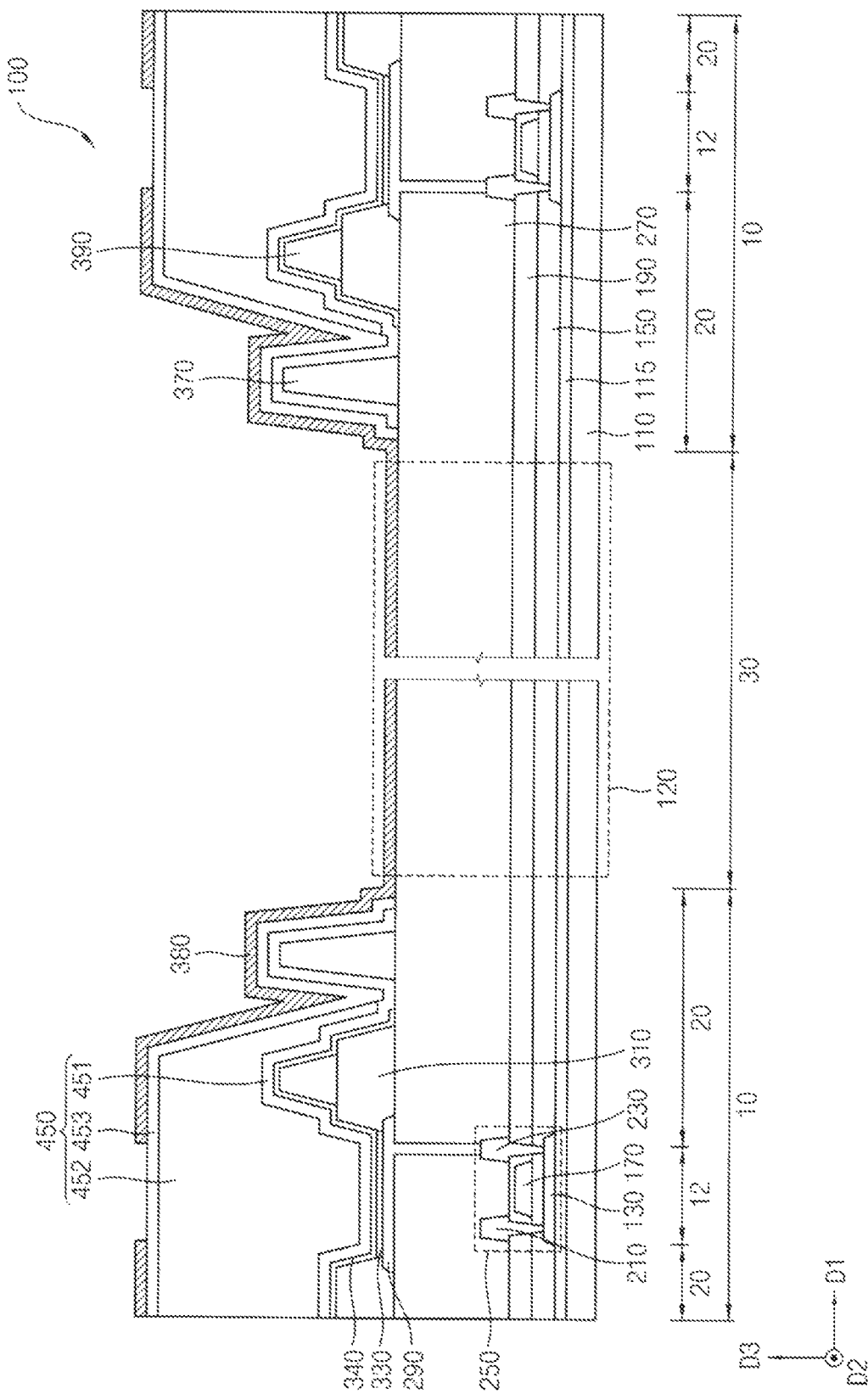

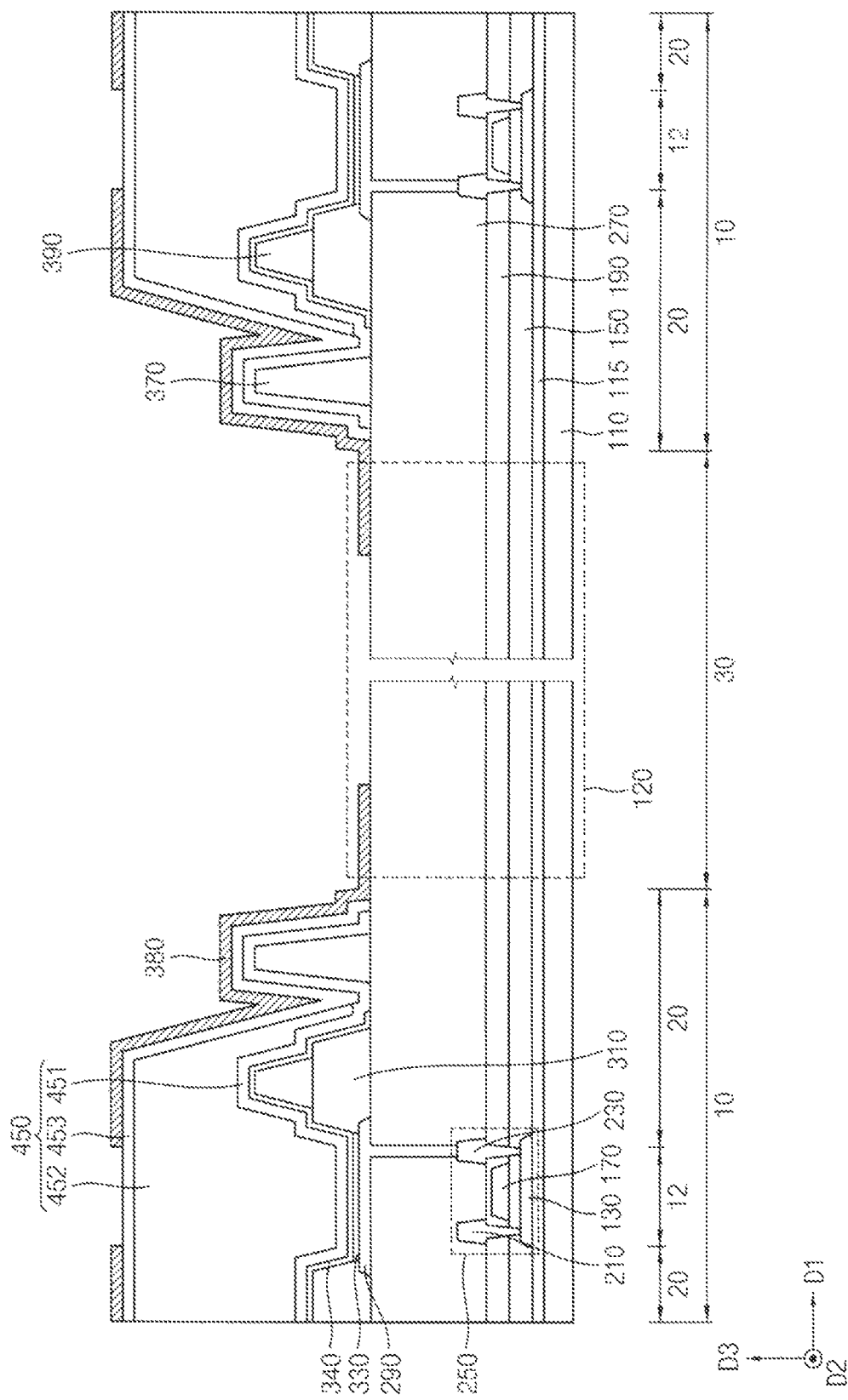

FIG. 6
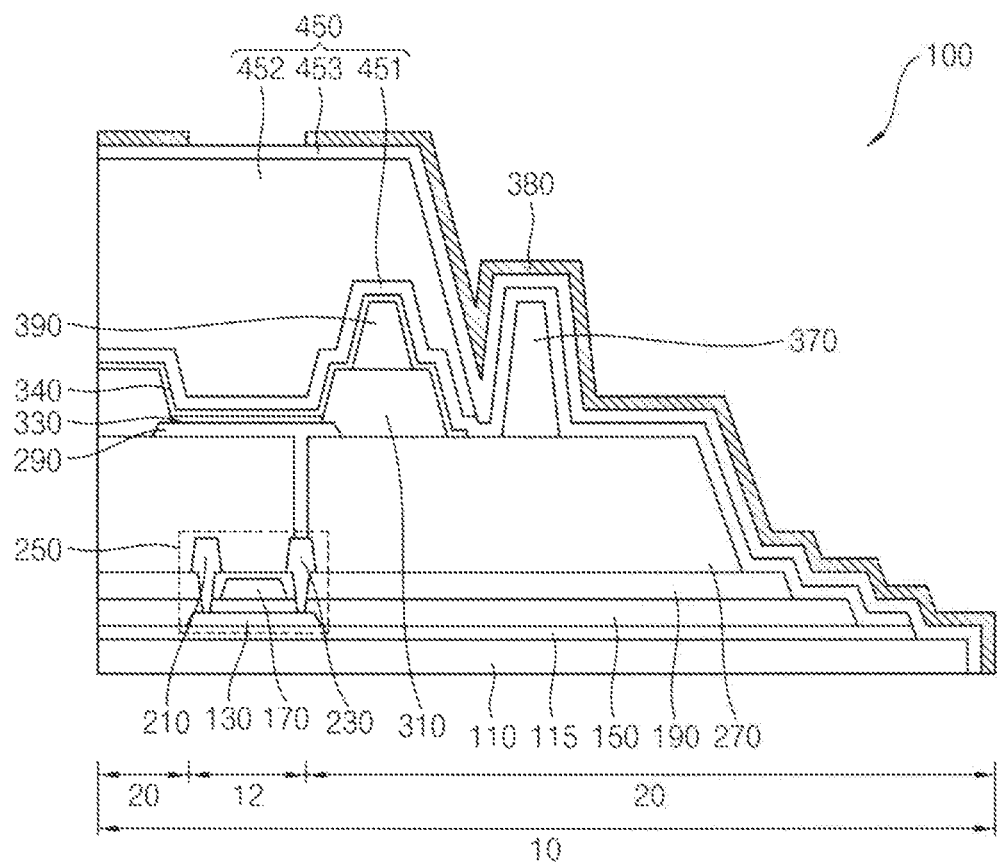
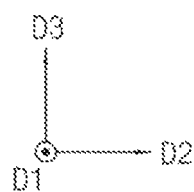

FIG. 21
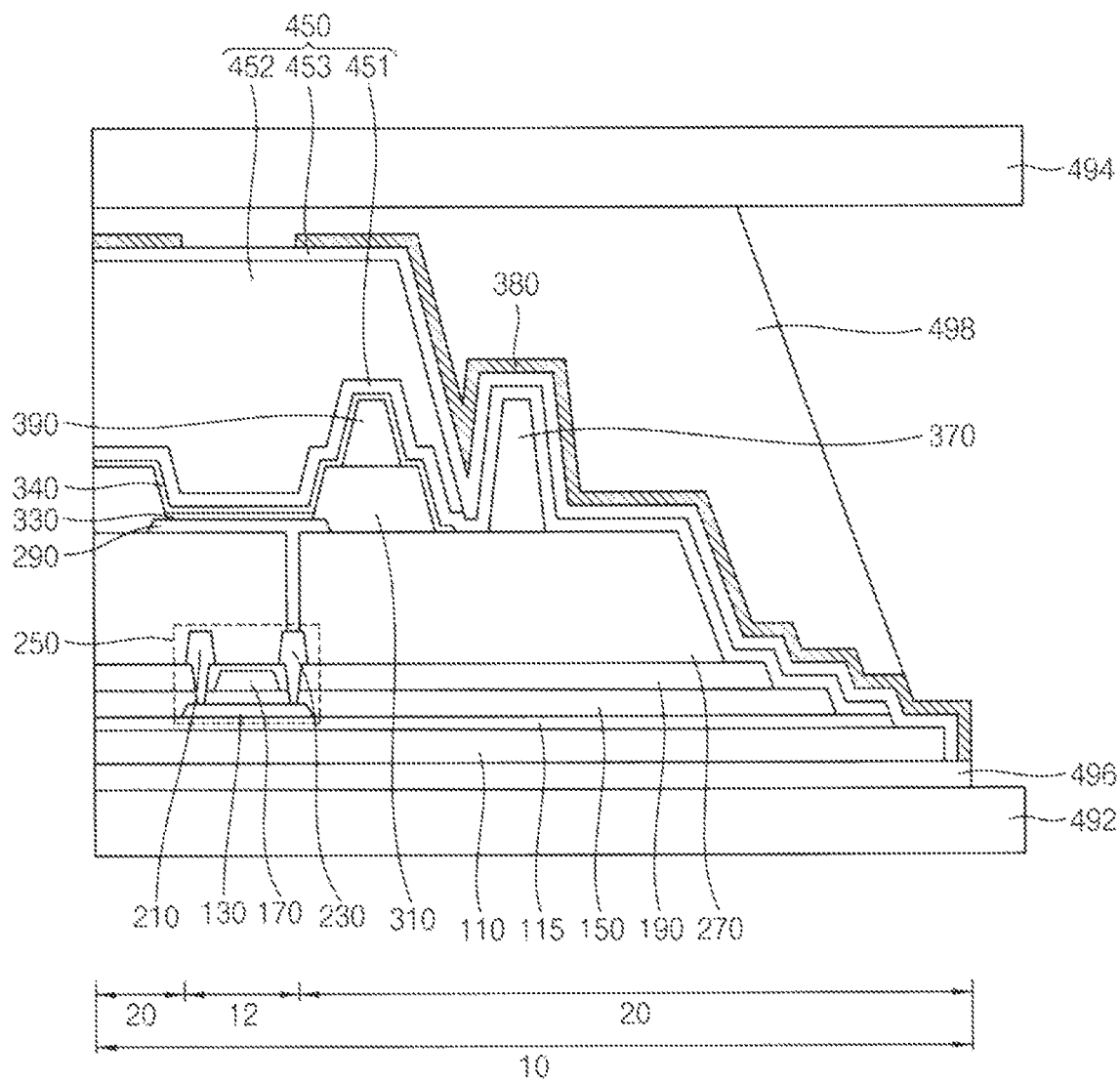
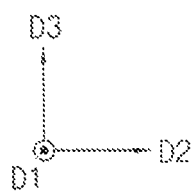

ORGANIC LIGHT EMITTING DISPLAY DEVICE

CROSS-REFERENCE TO RELATED APPLICATION(S)

This application claims priority under 35 USC § 119 to Korean Patent Applications No. 10-2016-0012867, filed on Feb. 2, 2016 in the Korean Intellectual Property Office (KIPO), the contents of which are incorporated herein in its entirety by reference.

BACKGROUND

1. Field

Example embodiments relate generally to organic light emitting display devices. More particularly, embodiments of the present inventive concept relate to organic light emitting display devices including a reflective region.

2. Description of the Related Art

A flat panel display (FPD) device is widely used as a display device of an electronic device because the FPD device is lightweight and thin compared to a cathode-ray tube (CRT) display device. Typical examples of the FPD device are a liquid crystal display (LCD) device and an organic light emitting display (OLED) device. Compared to the LCD device, the OLED device has many advantages such as a higher luminance and a wider viewing angle. In addition, the OLED device can be made thinner because the OLED device does not require a backlight unit. In the OLED device, electrons and holes are injected into an organic thin layer through a cathode and an anode, and then recombined in the organic thin layer to generate excitons, thereby a light of a certain wavelength can be emitted.

Recently, a mirror OLED device capable of reflecting an image of an object (or a target) that is located in the front of the OLED device by including a reflective region and a pixel region has been developed.

SUMMARY

Some example embodiments provide an organic light emitting display device capable of reflecting an image of an object that is located in the front.

According to one aspect of example embodiments, an organic light emitting display (OLED) device includes substrates, connection substrates, sub-pixel structures, a thin film encapsulation structure, and a reflection pattern. The substrates each has a pixel region, and is spaced apart from each other. The pixel region includes sub-pixel regions and reflective region surrounding the sub-pixel regions. The connection substrates connect adjacent substrates among the substrates. The sub-pixel structures are disposed in the sub-pixel regions on the substrates each. The thin film encapsulation structure is disposed on the sub-pixel structures. The reflection pattern is disposed in the reflective region on the thin film encapsulation structure.

In example embodiments, the substrates and the connection substrates may be integrally formed.

In example embodiments, the connection substrate may consist essentially of materials that have elasticity.

In example embodiments, the substrates each may have an island shape, and the connection substrates each may have a planar shape of a bar. When the substrates are irregularly arranged, a shape of the connection substrates each may be changed such that the irregular arrangements of the substrates are maintained.

In example embodiments, the substrates each may have an island shape, and the connection substrates each may have a substantially U shape, a substantially S shape, or a substantially W shape. When the substrates are irregularly arranged, a shape of the connection substrates each may be changed such that the irregular arrangements of the substrates are maintained.

In example embodiments, the substrates and the connection substrates may have a mesh structure including a plurality of openings, and the opening may be defined by adjacent four substrates among the substrates and adjacent four connection substrates among the connection substrates.

In example embodiments, the connection substrate may include a first connection substrate and a second connection substrate. The first connection substrate may extend in a first direction that is parallel to an upper surface of the substrate. The second connection substrate may extend in a second direction that is perpendicular to the first direction.

In example embodiments, a first side of the substrate may be in contact with the first connection substrate, and a second side of the substrate may be in contact with the second connection substrate.

In example embodiments, the reflection pattern may be disposed on the connection substrate.

In example embodiments, the reflection pattern may be disposed in at least a portion of the connection substrate, and may expose at least a portion of the connection substrate.

In example embodiments, the reflection pattern may include a first reflection pattern and a second reflection pattern. The first reflection pattern may be disposed in the reflective region on the thin film encapsulation structure, and may expose the connection substrate. The first reflection pattern may have a first thickness. The second reflection pattern may be interposed between the first reflection pattern and the thin film encapsulation structure, and may be disposed on the substrate and the connection substrate. The second reflection pattern may have a second thickness that is less than the first thickness.

In example embodiments, the thin film encapsulation structure may include a first thin film encapsulation layer, a second thin film encapsulation layer, and a third thin film encapsulation layer. The first thin film encapsulation layer may be disposed on the sub-pixel structure. The second thin film encapsulation layer may be disposed on the first thin film encapsulation layer. The third thin film encapsulation layer may be disposed on the second thin film encapsulation layer. The first and third thin film encapsulation layers may include inorganic materials, and the second thin film encapsulation layer may include organic materials.

In example embodiments, the OLED device may further include a buffer layer interposed between the substrate and the sub-pixel structure. The buffer layer may include inorganic materials, and may overlap the first and third thin film encapsulation layers in the outmost of the substrate. The buffer layer may be integrally formed using the same materials on the substrate and the connection substrate.

In example embodiments, the OLED device may further include a semiconductor element interposed between the substrate and the sub-pixel structure. The semiconductor element may include an active layer, a gate insulation layer, a gate electrode, an insulating interlayer, and source and drain electrodes. The active layer may be disposed on the substrate, and may have source and drain regions. The gate insulation layer may be disposed on the active layer. The gate electrode may be disposed on the gate insulation layer. The insulating interlayer may be disposed on the gate electrode. The source and drain electrodes may be disposed on the insulating interlayer, and the source and drain electrodes each may be in contact with the source and drain regions, respectively.

In example embodiments, the gate insulation layer is integrally formed using the same materials on the substrate and the connection substrate, and the insulating interlayer is integrally formed using the same materials on the substrate and the connection substrate.

In example embodiments, the OLED device may further include a planarization layer interposed between the semiconductor element and the sub-pixel structure. The planarization layer may be integrally formed using the same materials on the substrate and the connection substrate, and may have an opening that exposes a portion of an upper surface of the insulating interlayer disposed on the connection substrate in an outer portion of the connection substrate.

In example embodiments, the sub-pixel structure may include a lower electrode, a light emitting layer, and an upper electrode. The lower electrode may be in the sub-pixel region on the planarization layer. The light emitting layer may be disposed on the lower electrode. The upper electrode may be disposed on the light emitting layer.

In example embodiments, the OLED device may further include a pixel defining layer and a block structure. The pixel defining layer may be disposed in the reflective region on the planarization layer, and may cover both lateral portions of the lower electrode. The pixel defining layer may expose a portion of the lower electrode. The block structure may be spaced apart from the pixel defining layer, and may be in the same level with the pixel defining layer. The block structure may surround the pixel defining layer in an outer portion of the pixel region.

In example embodiments, the connection substrate may be disposed between the block structures that are disposed in adjacent two substrates among the substrates.

In example embodiments, the OLED device may further include a spacer on the pixel defining layer. The pixel defining layer, the spacer, and the block structure may be simultaneously formed using the same materials.

As an OLED device according to example embodiments includes a substrate, a flexible connection substrate, and the reflection pattern, the OLED device may be readily disposed on curved or irregular surfaces. In addition, the reflection pattern may reflect an image of an object that is located in the front of the OLED device. Accordingly, the OLED device may serve as a mirror OLED device having a curved shape.

BRIEF DESCRIPTION OF THE DRAWINGS

Example embodiments can be understood in more detail from the following description taken in conjunction with the accompanying drawings, in which:

FIG. 5A is a cross-sectional view taken along a line I-I' of FIG. 1;

FIG. 5B is a cross-sectional view illustrating an example of the OLED device of FIG. 1;

FIG. 6 is a cross-sectional view taken along a line II-II' of FIG. 1;

FIG. 21 is a cross-sectional view illustrating an OLED device in accordance with example embodiments.

DETAILED DESCRIPTION OF THE EMBODIMENTS

Hereinafter, embodiments of the present inventive concept will be explained in detail with reference to the accompanying drawings.

Figure 1:
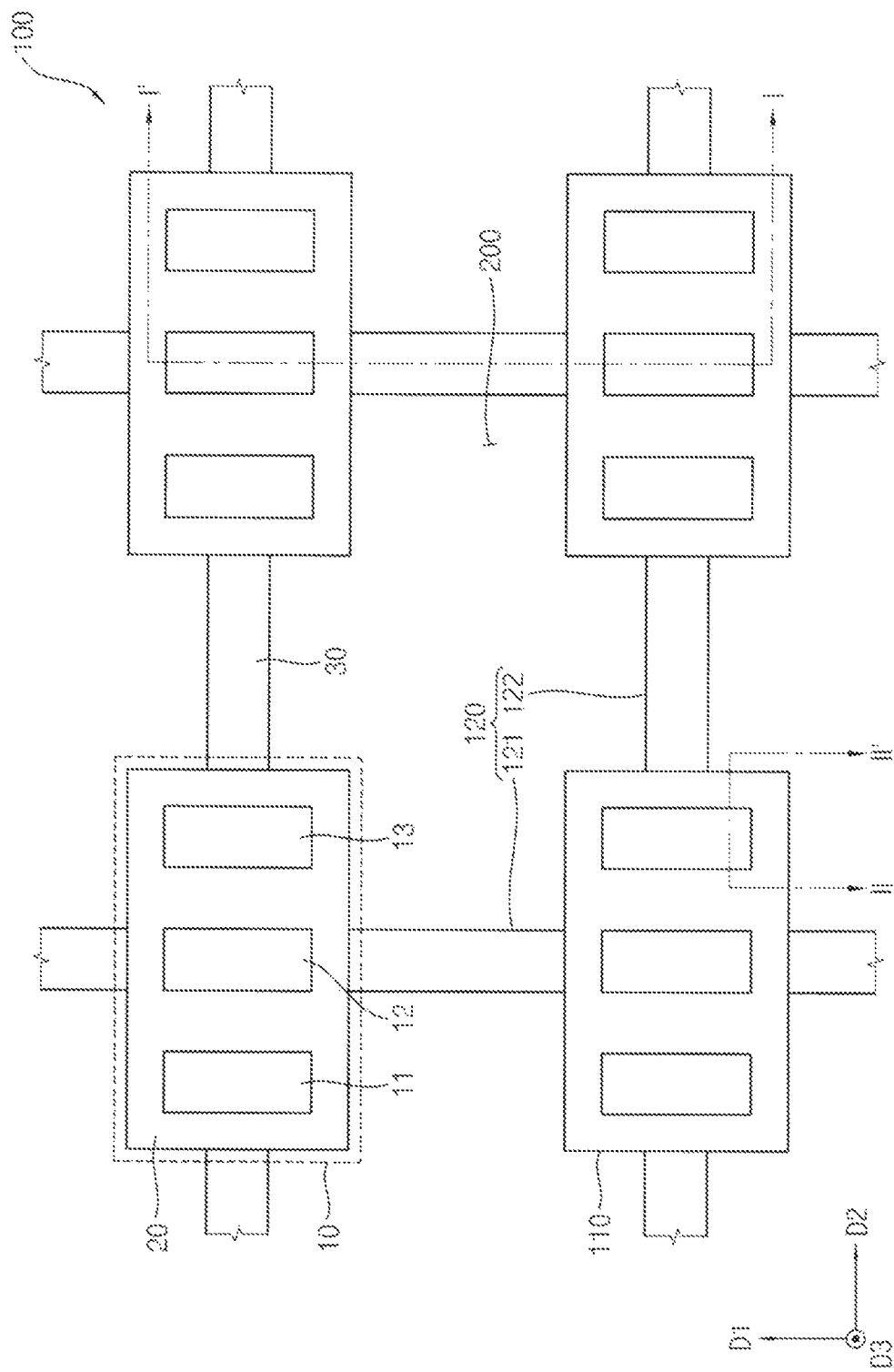
FIG. 1 is a perspective view illustrating an organic light emitting display (OLED) device in accordance with example embodiments.
Figure 2:
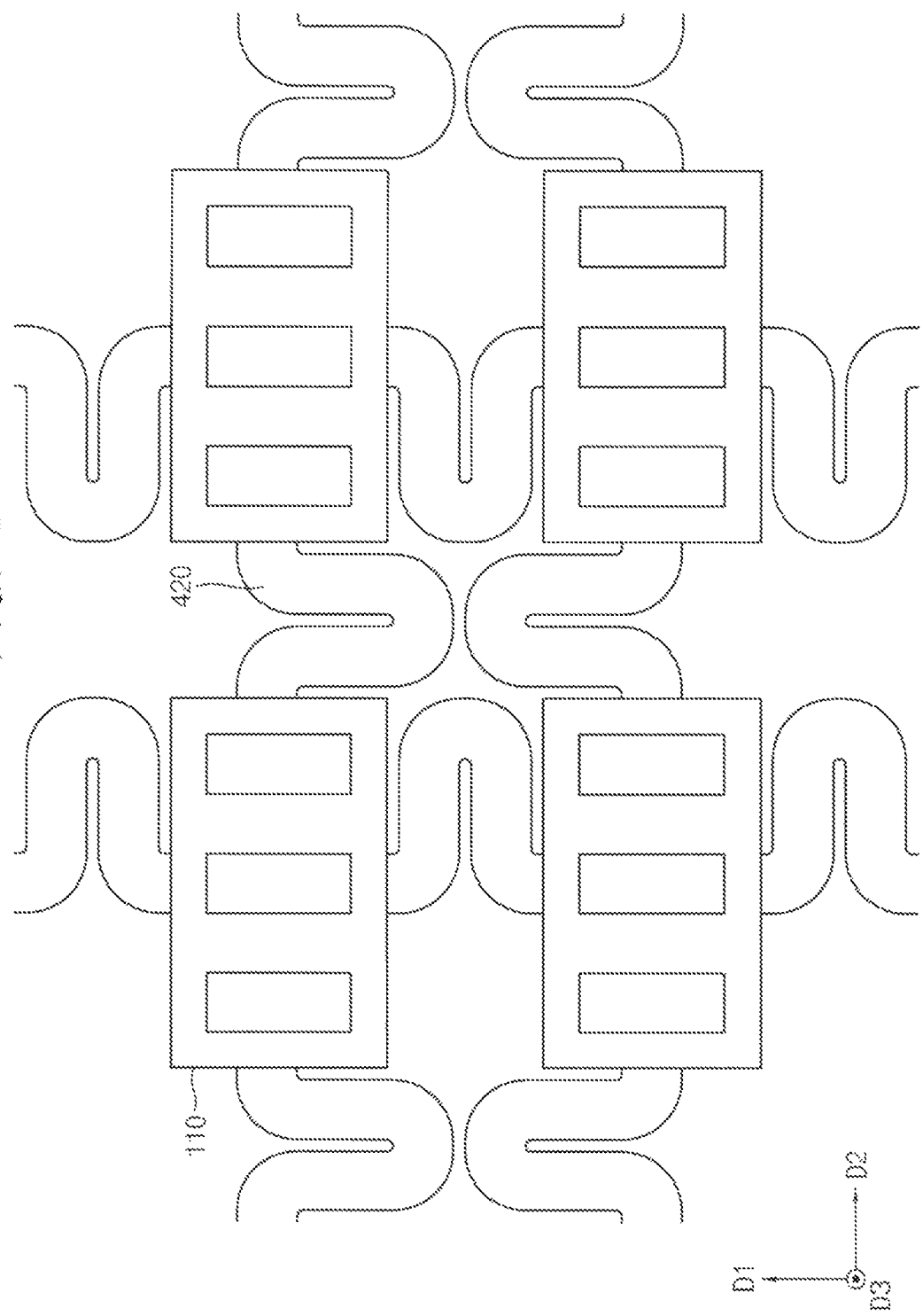
FIGS. 2, 3, and 4 are perspective views illustrating an example of a substrate and a connection substrate included in the OLED device of FIG. 1.
Figure 3:
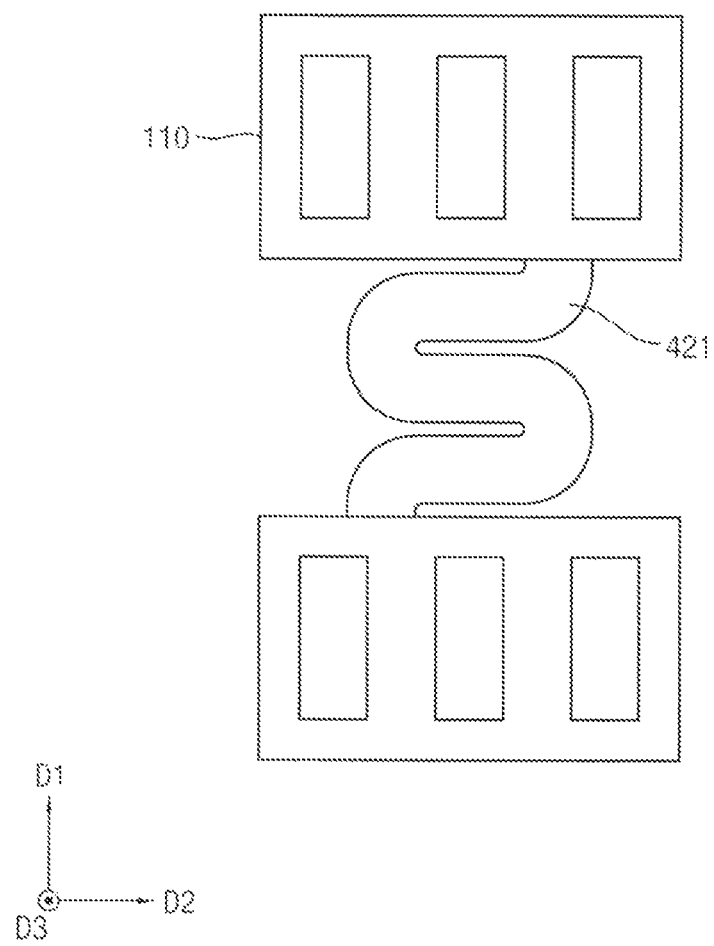
Figure 4:
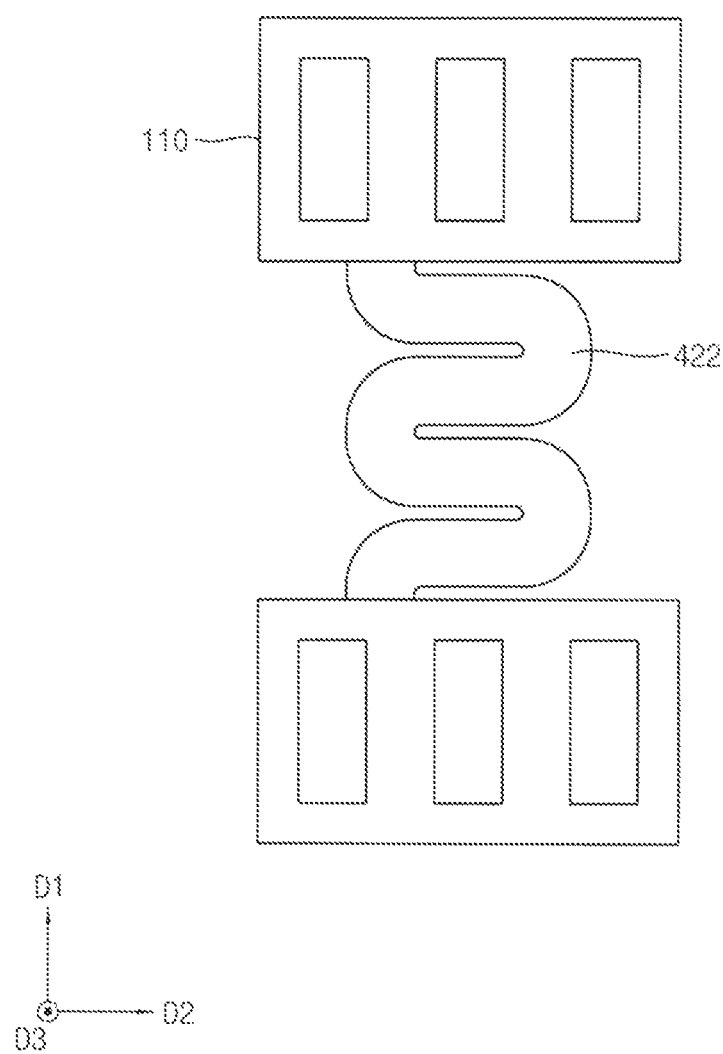

FIG. 1 is a perspective view illustrating an organic light emitting display (OILED) device in accordance with example embodiments, and FIGS. 2, 3, and 4 are perspective views illustrating an example of a substrate and a connection substrate included in the OLED device of FIG. 1

Referring to FIG. 1, an organic light emitting display (OLED) device 100 may include a plurality of pixel regions 10 and a plurality of connection regions 30. One pixel region 10 among the pixel regions 10 may include first, second, and third sub-pixel regions 11, 12, and 13 and a reflective region 20. For example, the pixel regions 10 each may include the first, second, and third sub-pixel regions 11, 12, and 13 and the reflective region 20. The reflective region 20 may substantially surround the first, second, and third sub-pixel regions 11, 12, and 13. In example embodiments, the pixel regions 10 may be spaced apart from each other. The connection region 30 may be located between adjacent pixel regions 10 among the pixel regions 10. That is, the connection region 30 may be interposed between the pixel regions 10 that are spaced apart from each other.

First through third sub-pixels may be disposed in the first through third sub-pixel regions 11, 12, and 13, respectively. For example, the first sub-pixel may emit a red color of a light, and the second sub-pixel may emit a green color of a light. In addition, the third sub-pixel may emit a blue color of a light. The first through third sub-pixels may be disposed at the same level on a substrate 110.

A reflection pattern may be disposed in the reflective region 20. The reflection pattern may reflect an external light. For example, the reflection pattern may reflect an image of an object that is located in a third direction D3 which is vertical to first and second directions D1 and D2 of the OLED device 100. Here, the first direction D1 may be parallel to an upper surface of the substrate 110, and the second direction D2 may be perpendicular to the first direction D1. In addition, the reflection pattern may include a plurality of openings. For example, the reflection pattern may include the openings that are located in the first through third sub-pixel regions each. The first through third sub-pixels may emit a light via the opening, and the OLED device 100 may display a displaying image in the third direction D3.

In example embodiments, one pixel region 10 of the OLED device 100 includes the first through third sub-pixel regions 11, 12, and 13, but not being limited thereto.

Conductive wirings (e.g., scan signal wirings, data signal wirings, power supply voltage wirings, etc) may be disposed in the connection region 30. Here, the conductive wirings may be electrically connected to a sub-pixel structure.

In example embodiments, a plurality of the substrates 110 each included in the OLED device 100 may include the pixel region 10, and a plurality of connection substrates 120 each included in the OLED device 100 may include the connection region 30. The substrates 110 each may have an island shape, and the connection substrates 120 each may have a planar shape of a bar. In addition, the substrates 110 and the connection substrates 120 may have a mesh structure having a plurality of openings 200. For example, the opening 200 may be defined by adjacent four substrates 110 among the substrates 110 and adjacent four connection substrates 120 connection substrates 120.

In example embodiments, a shape of the substrate 110 has a planar shape of a substantially rectangular shape, but is not limited thereto. For example, a shape of the substrate 110 may instead have a planar shape of a substantially triangle shape, a substantially diamond shape, a substantially polygonal shape, a substantially circular shape, a substantially track shape, or a substantially elliptical shape.

In example embodiments, when a shape of the substrate 110 has a planar shape of a substantially rectangular shape, the connection substrate 120 may include a first connection substrate 121 and a second connection substrate 122. The first connection substrate 121 may extend in the first direction D1 (e.g., a column direction) that is parallel to an upper surface of the substrate 110, and may be repeatedly arranged in the first direction D1. The second connection substrate 122 may extend in the second direction D2 (e.g., a row direction) that is perpendicular to the first direction D1, and may be repeatedly arranged in the second direction D2. For example, a first side of the substrate 110 (e.g., side walls of the substrate 110 which are parallel to the second direction D2) may be in contact with the first connection substrate 121, a second side of the substrate 110 (e.g., side walls of the substrate 110 which are parallel to the first direction D1) may be in contact with the second connection substrate 122.

The connection substrate 120 may consist essentially of materials having elasticity (or flexibility). In example embodiments, when the substrates 110 are irregularly arranged, a shape of the connection substrates 120 each may be changed such that the irregular arrangements of the substrates 110 are maintained. For example, the connection substrate 120 may be stretched, bent, or folded. In this case, a shape of the opening 200 may be changed.

Referring to FIGS. 2, 3, and 4, the connection substrate 120 may have a different shape. In example embodiments, as illustrated in FIG. 2, the connection substrate 420 may have a substantially U shape when the substrates are regularly arranged. In addition, as illustrate in FIG. 3, the connection substrate 421 may have a substantially S shape when the substrates are regularly arranged. Further, as illustrated in FIG. 4, the connection substrate 422 may have a substantially W shape when the substrates are regularly arranged. In this case, the elasticity of the connection substrates 420, 421, and 422 may be increased. For example, as the connection substrates 420, 421, and 422 may have a substantially spring shape, the connection substrates 420, 421, and 422 each may be stretched more than the connection substrate 120 having a planar shape of a bar. In addition, the connection substrates 420, 421, and 422 each and may be relatively readily bent or folded.

In example embodiments, the connection substrates 420, 421, and 422 have a substantially U shape, a substantially S shape, and a substantially W shape, respectively, but is not limited thereto. For example, the connection substrate 120 may have various shapes.

Referring again to FIG. 1, the substrates 110 and the connection substrates 120 may be integrally formed. For example, after a preliminary substrate is provided, the openings 200 may be formed in the preliminary substrate, and then the substrates 110 and the connection substrates 120 may be provided. That is, the substrates 110 and the connection substrates 120 may be simultaneously formed using the same materials.

As the OLED device 100 according to example embodiments includes the substrate 110, the connection substrate 120, and the reflection pattern, the OLED device 100 may be readily disposed on curved or irregularly surfaces. In addition, in the OLED device 100, an image of an object that is located in the front of the OLED device 100 may be reflected from the reflection pattern, and a displaying image and the image of the object that is located in the front of the OLED device may be simultaneously (or concurrently) displayed. Accordingly, the OLED device 100 may serve as a mirror OLED device having a curved shape.

FIG. 5A is a cross-sectional view taken along a line I-I' of FIG. 1, and FIG. 5B is a cross-sectional view illustrating an example of the OLED device of FIG. 1. FIG. 6 is a cross-sectional view taken along a line II-II' of FIG. 1.

Referring to FIGS. 5A and 6, an OLED device 100 may include a substrate 110, a connection substrate 120, a buffer layer 115, a semiconductor element 250, a planarization layer 270, a sub-pixel structure, a pixel defining layer 310, a spacer 390, a block structure 370, a thin film encapsulation structure 450, a reflection pattern 380, etc. Here, the semiconductor element 250 may include an active layer 130, a gate insulation layer 150, a gate electrode 170, an insulating interlayer 190, a source electrode 210, and a drain electrode 230, and the sub-pixel structure may include a lower electrode 290, a light emitting layer 330, and an upper electrode 340. In addition, the thin film encapsulation (TFE) structure 450 may include a first TFE layer 451, a second TFE layer 452, and a third TFE layer 453.

As described above, the OLED device 100 may include a plurality of pixel regions 10 and a plurality of connection regions 30. Here, one pixel region 10 among the pixel regions 10 may include a sub-pixel region 12 and a reflective region 20. The sub-pixel region 12 may be located between the reflective regions 20. The sub-pixel structure may be disposed in the sub-pixel region 12, and the semiconductor element 250 may be disposed in the pixel region 10. In addition, a displaying image may be displayed in a third direction D3 from the substrate 110 into the TFE structure 450 (e.g., the third direction D3 that is vertical to a first direction D1 and a second direction D2). Further, the reflection pattern 380 may be disposed in the reflective region 20 and the connection region 30, and an image of an object (e.g., a target located in the third direction D3 that is vertical to an upper surface of the reflection pattern 380) that is located in the front of the OLED device 100 may be disposed in the third direction D3 on the reflection pattern 380. As the OLED device 100 includes the reflection pattern 380 capable of reflecting an image of an object that is located in the front of the OLED device 100, the OLED device 100 may serve as a mirror OLED device having a top emission structure.

The substrate 110 may be provided. The substrate 110 may include transparent insulation materials. In example embodiments, the substrate 110 may consist essentially of transparent polyimide substrate. The transparent polyimide substrate may be formed of a flexible transparent resin substrate. In this case, the transparent polyimide substrate may include at least one polyimide layer and at least one barrier layer. For example, the transparent polyimide substrate may have a structure that the polyimide layer and the barrier layer are stacked on a rigid glass substrate. In a manufacturing the OLED device 100, after the buffer layer 115 is disposed on the barrier layer of the transparent polyimide substrate, the semiconductor element 250 and the sub-pixel structure may be disposed on the buffer layer 115. After the semiconductor element 250 and the sub-pixel structure are formed, the rigid glass substrate may be removed. It may be difficult to directly form the semiconductor element 250 and the sub-pixel structure on the transparent polyimide substrate because the transparent polyimide substrate is relatively thin and flexible. Accordingly, the semiconductor element 250 and the sub-pixel structure are formed on the transparent polyimide substrate with the rigid glass substrate attached to the transparent polyimide substrate, and then the transparent polyimide substrate including the polyimide layer and the barrier layer may serve as the substrate 110 of the OLED device 100 after the removal of the rigid glass substrate. As the OLED device 100 includes the pixel region 10 including the sub-pixel region 12 and the reflective region 20, the substrate 110 may also include the pixel region 10 including the sub-pixel region 12 and the reflective region 20.

The polyimide layer may include random copolymer or block copolymer. In addition, the polyimide layer may have a high transparency, a low coefficient of thermal expansion, and a high glass transition temperature. Since the polyimide layer includes an imide radical, a heat resistance, a chemical resistance, a wear resistance, and an electrical characteristics may be excellent.

The barrier layer may include organic materials or inorganic materials. The organic materials may include a photoresist, a polyacryl-based resin, a polyimide-based resin, a polyamide-based resin, a siloxane-based resin, an acryl-based resin, an epoxy-based resin, etc. In addition, the inorganic materials may include silicon compound, metal oxide, etc. For example, the barrier layer may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc. In some example embodiments, the substrate 110 may include a quartz substrate, a synthetic quartz substrate, a calcium fluoride substrate, a fluoride-doping quartz substrate, a sodalime substrate, a non-alkali substrate etc.

As illustrated in FIG. 1, the connection substrate 120 and the substrate 110 may be integrally formed. For example, after a preliminary substrate is provided, the openings 200 may be formed in the preliminary substrate, and then the substrates 110 and the connection substrates 120 may be provided. That is, the substrates 110 and the connection substrates 120 may be simultaneously formed using the same materials. That is, the substrates 110 and the connection substrates 120 may be simultaneously formed using the same materials. In example embodiments, a plurality of substrates 110 may be spaced apart from each other, and the connection substrate 120 may be disposed between adjacent substrates 110 among the substrates 110. That is, the connection substrate 120 may include the connection region 30, and the connection region 30 may be interposed between the pixel regions 10 that are spaced apart from each other. In example embodiments, the connection substrate 120 may be disposed between the block structures 370. The connection substrate 120 may have a planar shape of a bar. In addition, the substrates 110 and the connection substrates 120 may include a mesh structure having a plurality of openings. For example, the opening may be defined by adjacent four substrates 110 among the substrates 110 and adjacent four connection substrates 120 the connection substrates 120. The connection substrate 120 may consist essentially of materials having elasticity. Accordingly, when the substrates 110 are irregularly arranged, a shape of the connection substrates 120 each may be changed such that the irregular arrangements of the substrates 110 are maintained. For example, the connection substrate 120 may be stretched, bent, or folded. In this case, a shape of the opening 200 may be changed.

A buffer layer 115 may be disposed on the substrate 110 and the connection substrate 120. The buffer layer 115 may be disposed on the entire substrate 110 and the entire connection substrate 120. The buffer layer may prevent the diffusion of metal atoms and/or impurities from the substrate 110 into the semiconductor element 250 and the sub-pixel structure. Additionally, the buffer layer 115 may control a rate of a heat transfer in a crystallization process for forming the active layer 130, thereby obtaining a substantially uniform active layer 130. Furthermore, the buffer layer 115 may improve a surface flatness of the substrate 110 when a surface of the substrate 110 is relatively irregular. According to a type of the substrate 110, at least two buffer layers may be provided on the substrate 110, or the buffer layer 115 may not be disposed. In example embodiments, the buffer layer 115 may include inorganic materials, and may block moisture or water permeated via the substrate 110. As illustrated in FIG. 6, the buffer layer 115 may overlap the first TFE layer 451 and third TFE layer 453 in the outmost of the substrate 110. That is, the buffer layer 115 together with the TFE structure 450 may protect the sub-pixel structure and the semiconductor element 250. For example, the buffer layer 115 may include SiOx, SiNx, SiOxNy, etc.

The active layer 130 may be disposed in the sub-pixel region 12 on the buffer layer 115. The active layer 130 may include a source region and a drain region. For example, the active layer 130 may include an oxide semiconductor, an inorganic semiconductor (e.g., amorphous silicon, polysilicon, etc.), an organic semiconductor, etc.

The gate insulation layer 150 may be disposed on the buffer layer 115 and the active layer 130. The gate insulation layer 150 may cover the active layer 130 in the sub-pixel region 12 on the buffer layer 115, and may be disposed on the entire substrate 110 and the entire connection substrate 120. For example, the gate insulation layer 150 may sufficiently cover the active layer 130, and may have a substantially level surface without a step around the active layer 130. Alternatively, the gate insulation layer 150 may cover the active layer 130, and may be disposed as a substantially uniform thickness along a profile of the active layer 130. The gate insulation layer 150 may include organic materials or inorganic materials.

The gate electrode 170 may be disposed in the sub-pixel region 12 on the gate insulation layer 150. The gate electrode 170 may be disposed on the gate insulation layer 150 under which the active layer 130 is located. The gate electrode 170 may include a metal, a metal alloy, metal nitride, conductive metal oxide, transparent conductive materials, etc. These may be used alone or in a suitable combination thereof. Alternatively, the gate electrode 170 may have a multilayer structure.

The insulating interlayer 190 may be disposed on the gate insulation layer 150 and the gate electrode 170. The insulating interlayer 190 may cover the gate electrode 170 in the sub-pixel region 12 on the substrate 110, and may be disposed on the entire substrate 110 and the entire connection substrate 120. For example, the insulating interlayer 190 may sufficiently cover the gate electrode 170, and may have a substantially level surface without a step around the gate electrode 170. Alternatively, the insulating interlayer 190 may cover the gate electrode 170, and may be disposed as a substantially uniform thickness along a profile of the gate electrode 170. The insulating interlayer 190 may include organic materials or inorganic materials.

The source electrode 210 and the drain electrode 230 may be disposed in the sub-pixel region 12 on the insulating interlayer 190. The source electrode 210 may be in contact with the source region of the active layer 130 via a contact hole formed by removing a portion of the gate insulation layer 150 and the insulating interlayer 190 each. The drain electrode 230 may be in contact with the drain region of the active layer 130 via a contact hole formed by removing a portion of the gate insulation layer 150 and the insulating interlayer 190 each. Each of the source electrode 210 and the drain electrode 230 may include a metal, an alloy, metal nitride, conductive metal oxide, transparent conductive materials, etc. These may be used alone or in a suitable combination thereof. Alternatively, each of the source electrode 210 and the drain electrode 230 may have a multilayer structure. Accordingly, the semiconductor element 250 including the active layer 130, the gate insulation layer 150, the gate electrode 170, the insulating interlayer 190, the source electrode 210, and the drain electrode 230 may be disposed.

The planarization layer 270 may be disposed on the insulating interlayer 190, the source electrode 210, and the drain electrode 230. The planarization layer 270 may cover the source electrode 210 and the drain electrode 230 in the sub-pixel region 12 on the substrate 110, and may be disposed on the entire substrate 110 and the entire connection substrate 120. For example, the planarization layer 270 may be disposed as a high thickness to sufficiently cover the insulating interlayer 190 and the source and drain electrodes 210 and 230. In this case, the planarization layer 270 may have a substantially flat upper surface, and a planarization process may be further performed on the planarization layer 270 to implement the flat upper surface of the planarization layer 270. The planarization layer 270 may include organic materials or inorganic materials.

The lower electrode 290 may be disposed in the sub-pixel region 12 on the planarization layer 270. For example, a thickness of the lower electrode 290 may be greater than that of the upper electrode 340 such that the lower electrode 290 reflects a light emitted from the light emitting layer 330 in the third direction D3. The lower electrode 290 may be in contact with the drain electrode 230 via a contact hole formed by removing a portion of the planarization layer 270. In addition, the lower electrode 290 may be electrically connected to the semiconductor element 250. For example, the lower electrode 290 may include a metal, a metal alloy, metal nitride, conductive metal oxide, transparent conductive materials, etc. These may be used alone or in a suitable combination thereof. In some example embodiments, the lower electrode 290 may have a multilayer structure.

The pixel defining layer 310 may be disposed on the planarization layer 270 and a portion of the lower electrode 290. For example, the pixel defining layer 310 may cover both lateral portions (or, lateral portion in a plan view) of the lower electrode 290 such that a portion of an upper surface of the lower electrode 290 is exposed. In this case, the light emitting layer 330 may be disposed on the portion of the lower electrode 290 exposed by the pixel defining layer 310. The pixel defining layer 310 may include organic materials or inorganic materials.

The light emitting layer 330 may be disposed in a portion where an upper surface of the lower electrode 290 is exposed by the pixel defining layer 310. The light emitting layer 330 may be formed using at least one of light emitting materials capable of generating different colors of light (e.g., a red color of light, a blue color of light, and a green color of light, etc) according to sub-pixels. Alternatively, the light emitting layer 330 may generally generate a white color of light by stacking a plurality of light emitting materials capable of generating different colors of light such as a red color of light, a green color of light, a blue color of light, etc. In this case, a color filter may be disposed on the light emitting layer 330. For example, the color filter may be disposed to overlap the light emitting layer 330 on the TFE structure 450, or may be disposed in an opening of the reflection pattern 380. The color filter may include at least one selected from a red color filter, a green color filter, and a blue color filter. Alternatively, the color filter may include a yellow color filter, a cyan color filter, and a magenta color filter. The color filter may be formed of a photosensitive resin (or color photoresist), etc.

The block structure 370 may be disposed in the reflective region 20 on the planarization layer 270. The block structure 370 and the pixel defining layer 310 may be disposed at the same level, and may be spaced apart from each other. In addition, the block structure 370 may surround the pixel defining layer 310 in an outer portion of the pixel region 10. In addition, the block structure 370 may have a predetermined height capable of finally blocking a leakage (or overflow) of the second TFE layer 452. In example embodiments, as the pixel defining layer 310 is spaced apart from the block structure 370, the first TFE layer 451 and the third TFE layer 453 may be disposed between the pixel defining layer 310 and the block structure 370. In this case, the structure may block moisture or water that is permeated from the outside into the inside of the OLED device 100. The block structure 370 may include organic materials or inorganic materials. Alternatively, the block structure 370 may further include an extra block structure to finally block a leakage of the second TFE layer 452.

The spacer 390 may be disposed in the reflective region 20 on the pixel defining layer 310. The spacer 390 may perform the same function with the block structure 370 capable of finally blocking a leakage of the second TFE layer 452, and may perform a function supporting a metal mask. The spacer 390 may include organic materials or inorganic materials. In example embodiments, the pixel defining layer 310, the spacer 390, and the block structure 370 may be simultaneously formed as the same materials using a half tone silt mask.

The upper electrode 340 may be disposed in the sub-pixel region 12 and a portion of the reflective region 20 on the pixel defining layer 310, the spacer 390, and the light emitting layer 330. In the sub-pixel region 12, the OLED device 100 may emit predetermined light for displaying an image in the third direction D3 (e.g., a top emission method). Thus, a thickness of the upper electrode 340 may be less than that of the lower electrode 290 such that a light emitted from the light emitting layer 330 is transmitted in the third direction D3 through the upper electrode 340. The upper electrode 340 may include a metal, a metal alloy, metal nitride, conductive metal oxide, transparent conductive materials, etc. Alternatively, the upper electrode 340 may have a multilayer structure. Accordingly, the sub-pixel structure including the lower electrode 290, the light emitting layer 330, and the upper electrode 340 may be disposed.

The TFE structure 450 may be disposed in the pixel region 10 on the upper electrode 340 and the block structure 370. For example, the first TFE layer 451 of the TFE structure 450 may be disposed on the sub-pixel structure. The first TFE layer 451 may cover the upper electrode 340 and the block structure 370, and may be disposed as a substantially uniform thickness along a profile of the upper electrode 340 and the block structure 370. The first TFE layer 451 may prevent the sub-pixel structure from being deteriorated by the permeation of moisture, water, oxygen, etc. In addition, the first TFE layer 451 may protect the sub-pixel structure from external impacts. The first TFE layer 451 may include inorganic materials.

The second TFE layer 452 may be disposed on the first TFE layer 451. The second TFE layer 452 may improve the flatness of the OLED device 100, and may protect the sub-pixel structure disposed in the sub-pixel region 12. The second TFE layer 452 may include organic materials.

The third TFE layer 453 may be disposed on the second TFE layer 452 and the first TFE layer 451. The third TFE layer 453 may cover the second TFE layer 452 and the first TFE layer 451, and may be disposed as a substantially uniform thickness along a profile of the second TFE layer 452 and the first TFE layer 451. The third TFE layer 453 together with the first TFE layer 451 and the second TFE layer 452 may prevent the sub-pixel structure from being deteriorated by the permeation of moisture, water, oxygen, etc. In addition, the third TFE layer 453 together with the first TFE layer 451 and the second TFE layer 452 may protect the sub-pixel structure from external impacts. The third TFE layer 453 may include inorganic materials.

Alternatively, the TFE structure 450 may have five layers structure where first to fifth TFE layers are stacked or seven layers structure where the first to seventh TFE layers are stacked. In some example embodiments, when the substrate 110 is formed as a rigid glass substrate, the TFE structure 450 may be formed as a rigid glass substrate such as a quartz substrate, a synthetic quartz substrate, a calcium fluoride substrate, a fluoride-doping quartz substrate, a sodalime substrate, a non-alkali substrate etc.

The reflection pattern 380 may be disposed on the TFE structure 450 and the planarization layer 270. That is, the reflection pattern 380 may be entirely disposed in the pixel region 10 and the connection region 30 on the substrate 110 and the connection substrate 120. The reflection pattern 380 may expose the sub-pixel region 12. As described above, as the OLED device 100 includes the reflection pattern 380, the OLED device 100 may reflect an image of an object that is located in the front of the OLED device 100 in the third direction D3.

In some example embodiments, as illustrated in FIG. 5B, the reflection pattern 380 may expose at least a portion of the connection substrate 120. That is, the reflection pattern 380 may expose the sub-pixel region 12, and may be entirely disposed in the pixel region 10 on the substrate 110. In addition, the reflection pattern 380 may be disposed in a portion of the connection substrate 120. In this case, as the reflection pattern 380 is disposed in a portion of the connection substrate 120, elasticity of the connection substrate 120 may be relatively increased.

The reflection pattern 380 may include a metal, a metal alloy, metal nitride, conductive metal oxide, transparent conductive materials, etc. For example, the reflection pattern 380 may be formed of gold (Au), silver (Ag), aluminum (Al), platinum (Pt), nickel (Ni), titanium (Ti), palladium (Pd), magnesium (Mg), Calcium (Ca), Lithium (Li), chrome (Cr), tantalum (Ta), tungsten (W), copper (Cu), molybdenum (Mo), scandium (Sc), neodymium (Nd), Iridium (Ir), an alloy of aluminum, aluminum nitride (AlNx), an alloy of silver, tungsten nitride (WNx), an alloy of copper, an alloy of molybdenum, titanium nitride (TiNx), chrome nitride (CrNx), tantalum nitride (TaNx), strontium ruthenium oxide (SRO), zinc oxide (ZnOx), indium tin oxide (ITO), stannum oxide (SnOx), indium oxide (InOx), gallium oxide (GaOx), indium zinc oxide (IZO), etc. These may be used alone or in a suitable combination thereof. Alternatively, the reflection pattern 380 may have a multilayer structure.

As the OLED device 100 in accordance with example embodiments includes the substrate 110, the connection substrate 120, and the reflection pattern 380, the OLED device 100 may be readily disposed on curved or irregularly surfaces. In addition, in the OLED device 100, an image of an object that is located in the front of the OLED device 100 may be reflected from the reflection pattern 380, and a displaying image and the object that is located in the front of the OLED device 100 may be simultaneously displayed. Accordingly, the OLED device 100 may serve as a mirror OLED device having a curved shape.

FIGS. 7, 8, 9, 10, 11, 12, 13, 14, 15, and 16 are cross-sectional views illustrating a method of manufacturing an OLED device in accordance with example embodiments.

Figure 7:
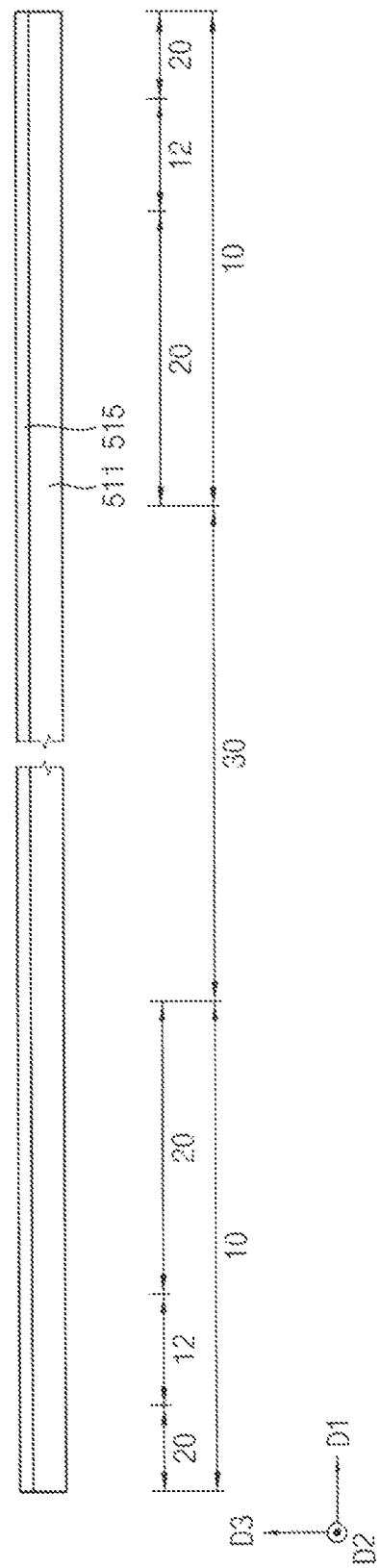
FIGS. 7, 8, 9, 10, 11, 12, 13, 14, 15, and 16 are cross-sectional views illustrating a method of manufacturing an OLED device in accordance with example embodiments.
Figure 8:
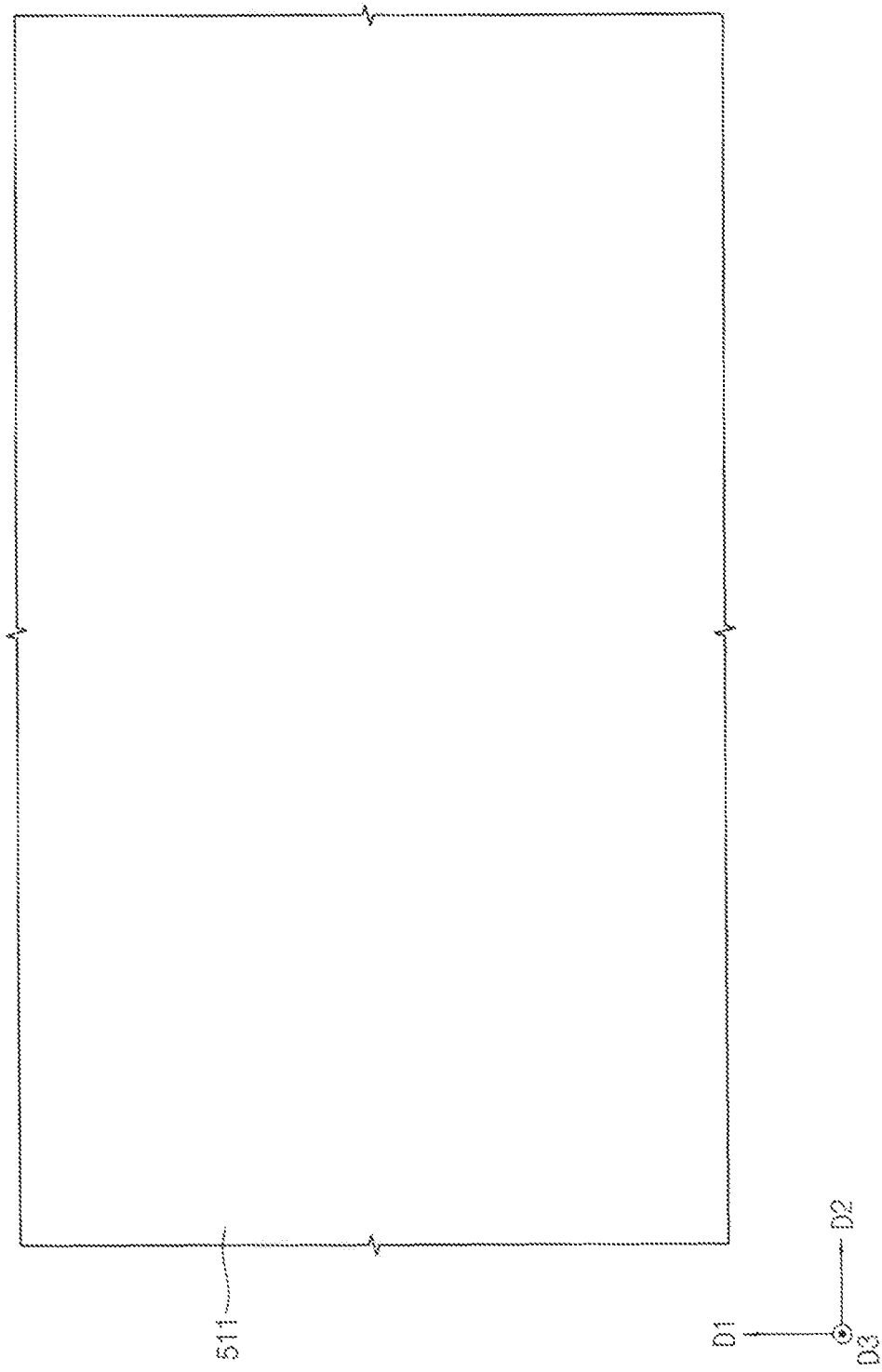

Referring to FIGS. 7 and 8, a preliminary substrate 511 may be provided. The preliminary substrate 511 may have a plate shape. The preliminary substrate 511 may include a pixel region 10 and a connection region 30. Here, the pixel region 10 may include a sub-pixel region 12 and a reflective region 20.

The preliminary substrate 511 may consist essentially of transparent polyimide substrate. The transparent polyimide substrate may be formed using a flexible transparent resin substrate. In this case, the transparent polyimide substrate may include at least one polyimide layer and at least one barrier layer.

The polyimide layer may be formed using random copolymer or block copolymer. In addition, the polyimide layer may have a high transparency, a low coefficient of thermal expansion, and a high glass transition temperature. Since the polyimide layer includes an imide radical, a heat resistance, a chemical resistance, a wear resistance, and an electrical characteristics may be excellent.

The barrier layer may include organic materials or inorganic materials. The organic materials may be formed using a photoresist, a polyacryl-based resin, a polyimide-based resin, a polyamide-based resin, a siloxane-based resin, an acryl-based resin, an epoxy-based resin, etc. In addition, the inorganic materials may be formed using silicon compound, metal oxide, etc. For example, the barrier layer may be formed of SiOx, SiNx, SiOxNy, SiOxCy, SiCxNy, AlOx, AlNx, TaOx, HfOx, ZrOx, TiOx, etc.

A buffer layer 515 may be formed on the preliminary substrate 511. The buffer layer 515 may be formed on the entire preliminary substrate 511. The buffer layer may prevent the diffusion of metal atoms and/or impurities from the preliminary substrate 511 into a semiconductor element and a sub-pixel structure. Additionally, the buffer layer 115 may control a rate of a heat transfer in a crystallization process for forming an active layer, thereby obtaining substantially uniform the active layer. Furthermore, the buffer layer 515 may improve a surface flatness of the preliminary substrate 511 when a surface of the preliminary substrate 511 is relatively irregular. According to a type of the preliminary substrate 511, at least two buffer layers may be provided on the preliminary substrate 511, or the buffer layer 511 may not be disposed. In example embodiments, the buffer layer 511 may include inorganic materials, and may block moisture or water permeated via the preliminary substrate 511. For example, the buffer layer 515 may be formed SiOx, SiNx, SiOxNy, etc.

Figure 9:
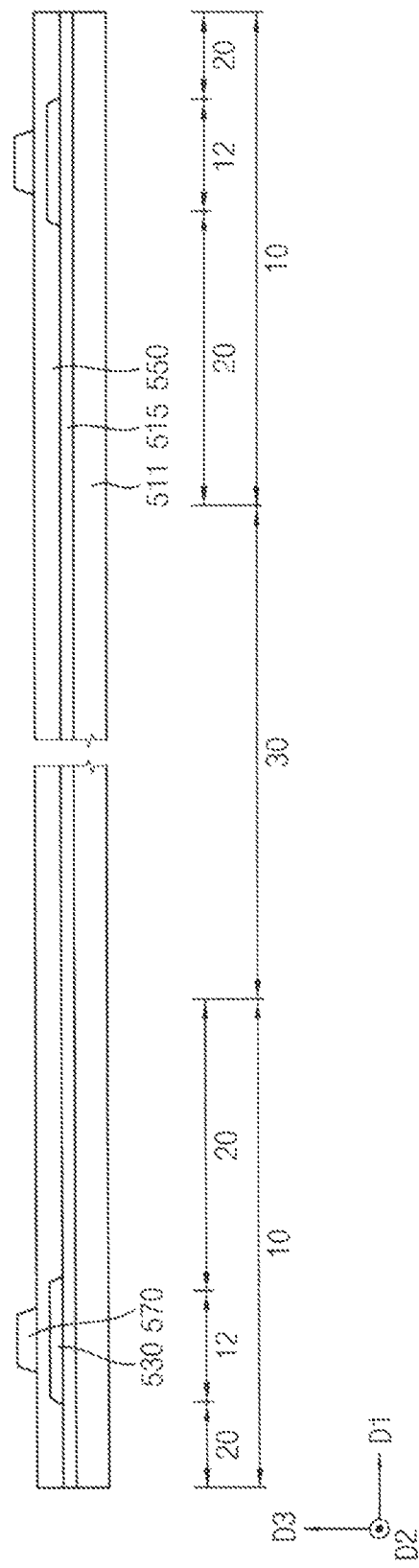

Referring to FIG. 9, an active layer 530 may be disposed in the sub-pixel region 12 on the buffer layer 515. The active layer 530 may include a source region and a drain region. For example, the active layer 530 may be formed an oxide semiconductor, an inorganic semiconductor, an organic semiconductor, etc.

A gate insulation layer 550 may be formed on the buffer layer 515 and the active layer 530. The gate insulation layer 550 may cover the active layer 530 in the sub-pixel region 12 on the buffer layer 515, and may be formed on the entire preliminary substrate 511. For example, the gate insulation layer 550 may sufficiently cover the active layer 530, and may have a substantially level surface without a step around the active layer 530. Alternatively, the gate insulation layer 550 may cover the active layer 530, and may be formed as a substantially uniform thickness along a profile of the active layer 530. The gate insulation layer 550 may be formed using organic materials or inorganic materials.

A gate electrode 570 may be formed in the sub-pixel region 12 on the gate insulation layer 550. The gate electrode 570 may be formed on the gate insulation layer 550 under which the active layer 530 is located. The gate electrode 570 may be formed using a metal, a metal alloy, metal nitride, conductive metal oxide, transparent conductive materials, etc. These may be used alone or in a suitable combination thereof. Alternatively, the gate electrode 570 may be formed as a multilayer structure.

Figure 10:
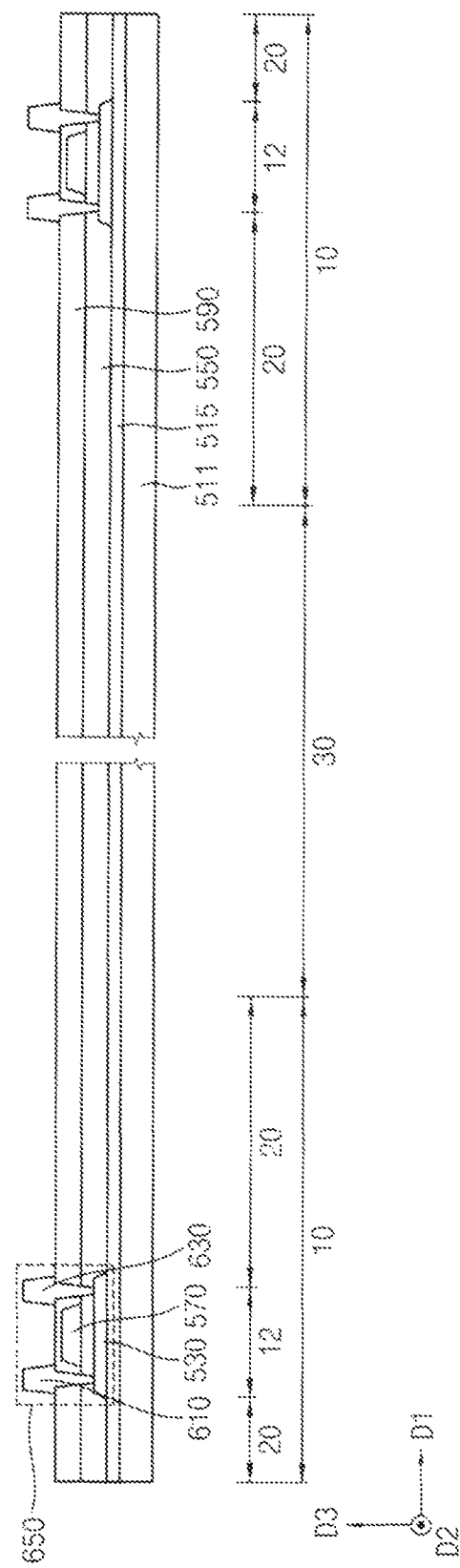

Referring to FIG. 10, an insulating interlayer 590 may be formed on the gate insulation layer 550 and the gate electrode 570. The insulating interlayer 590 may cover the gate electrode 570 in the sub-pixel region 12 on the preliminary substrate 511, and may be formed on the entire preliminary substrate 511. For example, the insulating interlayer 590 may sufficiently cover the gate electrode 570, and may have a substantially level surface without a step around the gate electrode 570. Alternatively, the insulating interlayer 590 may cover the gate electrode 570, and may be formed as a substantially uniform thickness along a profile of the gate electrode 570. The insulating interlayer 590 may be formed using organic materials or inorganic materials.

Source electrode 610 and the drain electrode 630 may be formed in the sub-pixel region 12 on the insulating interlayer 590. The source electrode 610 may be in contact with the source region of the active layer 530 via a contact hole formed by removing a portion of the gate insulation layer 550 and the insulating interlayer 590 each. The drain electrode 630 may be in contact with the drain region of the active layer 530 via a contact hole formed by removing a portion of the gate insulation layer 550 and the insulating interlayer 590 each. Each of the source electrode 610 and the drain electrode 630 may be formed using a metal, an alloy, metal nitride, conductive metal oxide, transparent conductive materials, etc. These may be used alone or in a suitable combination thereof. Alternatively, each of the source electrode 610 and the drain electrode 630 may have a multilayer structure. Accordingly, a semiconductor element 650 including the active layer 530, the gate insulation layer 550, the gate electrode 570, the insulating interlayer 590, the source electrode 610, and the drain electrode 630 may be formed.

Figure 11:
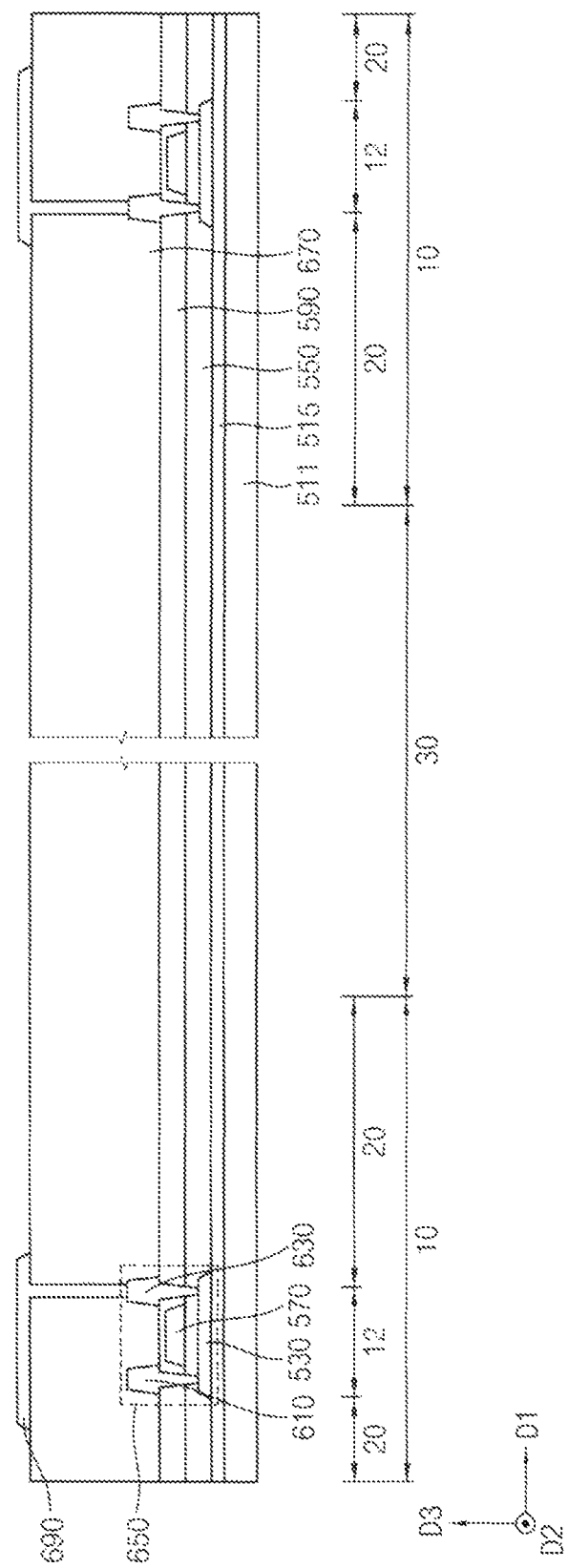

Referring to FIG. 11, a planarization layer 670 may be formed on the insulating interlayer 590, the source electrode 610, and the drain electrode 630. The planarization layer 670 may cover the source electrode 610 and the drain electrode 630 in the sub-pixel region 12 on the preliminary substrate 511, and may be formed on the entire preliminary substrate 511. For example, the planarization layer 670 may be formed as a high thickness to sufficiently cover the insulating interlayer 590 and the source and drain electrodes 610 and 630. In this case, the planarization layer 670 may have a substantially flat upper surface, and a planarization process may be further performed on the planarization layer 670 to implement the flat upper surface of the planarization layer 670. The planarization layer 670 may be formed using organic materials or inorganic materials.

A lower electrode 690 may be formed in the sub-pixel region 12 on the planarization layer 670. The lower electrode 690 may be in contact with the drain electrode 630 via a contact hole formed by removing a portion of the planarization layer 670. In addition, the lower electrode 690 may be electrically connected to the semiconductor element 650. For example, the lower electrode 690 may be formed using a metal, a metal alloy, metal nitride, conductive metal oxide, transparent conductive materials, etc. These may be used alone or in a suitable combination thereof. In some example embodiments, the lower electrode 290 may have a multilayer structure.

Figure 12:
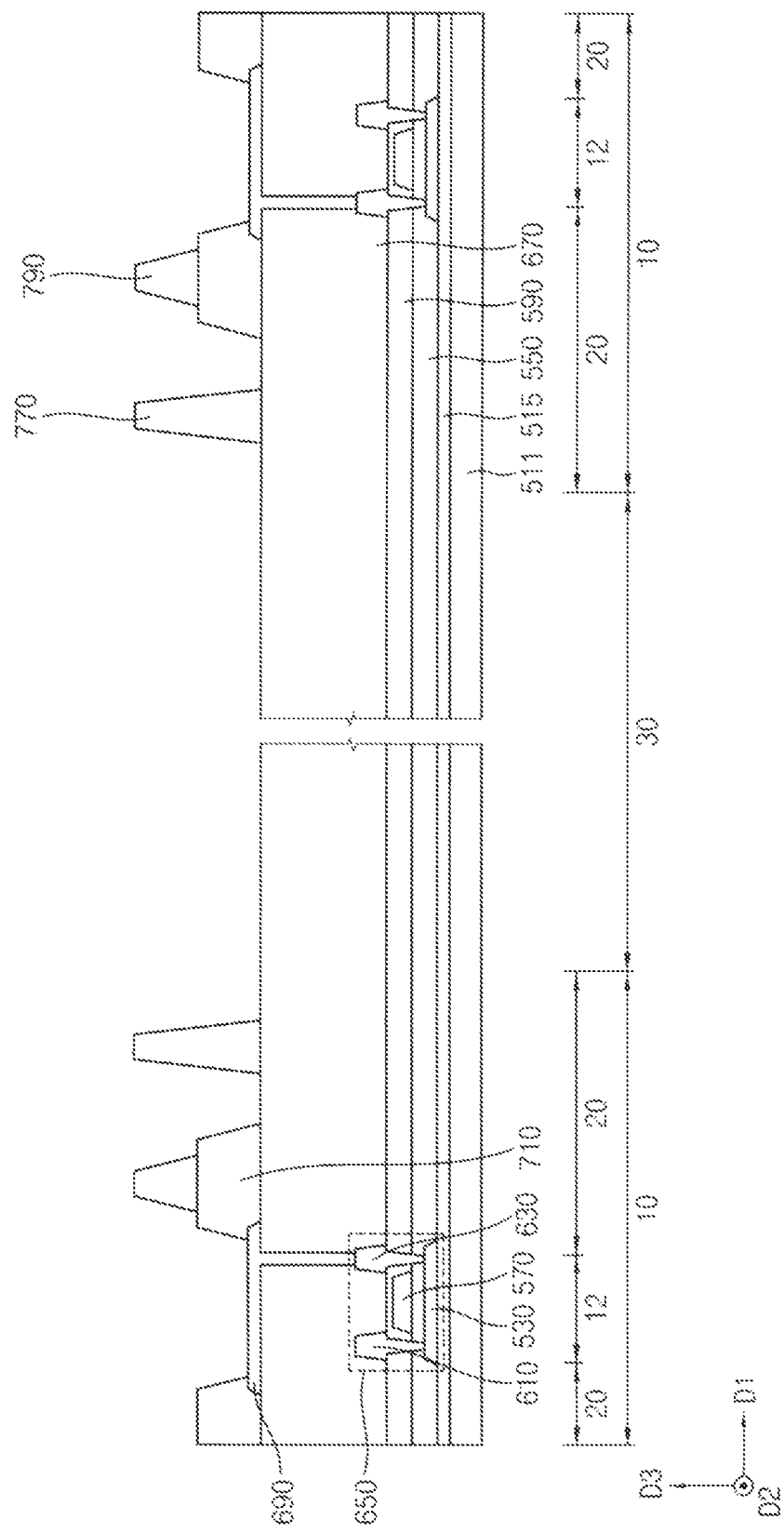

Referring to FIG. 12, a pixel defining layer 710 may be formed on the planarization layer 670 and a portion of the lower electrode 690. For example, the pixel defining layer 710 may cover both lateral portions of the lower electrode 690 such that a portion of an upper surface of the lower electrode 690 is exposed. In this case, a light emitting layer may be located on the portion of the lower electrode 690 exposed by the pixel defining layer 710. The pixel defining layer 710 may be formed using organic materials or inorganic materials.

A block structure 770 may be formed in the reflective region 20 on the planarization layer 670. The block structure 770 and the pixel defining layer 710 may be formed at the same level, and may be spaced apart from each other. In addition, the block structure 770 may surround the pixel defining layer 710 in an outer portion of the pixel region 10. In addition, the block structure 770 may have a predetermined height. The block structure 770 may be formed using organic materials or inorganic materials.

A spacer 790 may be formed in the reflective region 20 on the pixel defining layer 710. The spacer 790 may perform a function supporting a metal mask. The spacer 790 may be formed using organic materials or inorganic materials. In example embodiments, the pixel defining layer 710, the spacer 790, and the block structure 770 may be simultaneously formed as the same materials using a half tone silt mask. For example, a preliminary insulation layer may be formed on the planarization layer 670. After the preliminary insulation layer is formed, a first portion where the preliminary insulation layer is not removed, a second portion where a portion of the preliminary insulation layer is removed, and a third portion where the preliminary insulation layer is completely removed may be formed using the half tone silt mask. Accordingly, the pixel defining layer 710, the spacer 790, and the block structure 770 may be formed.

Figure 13:
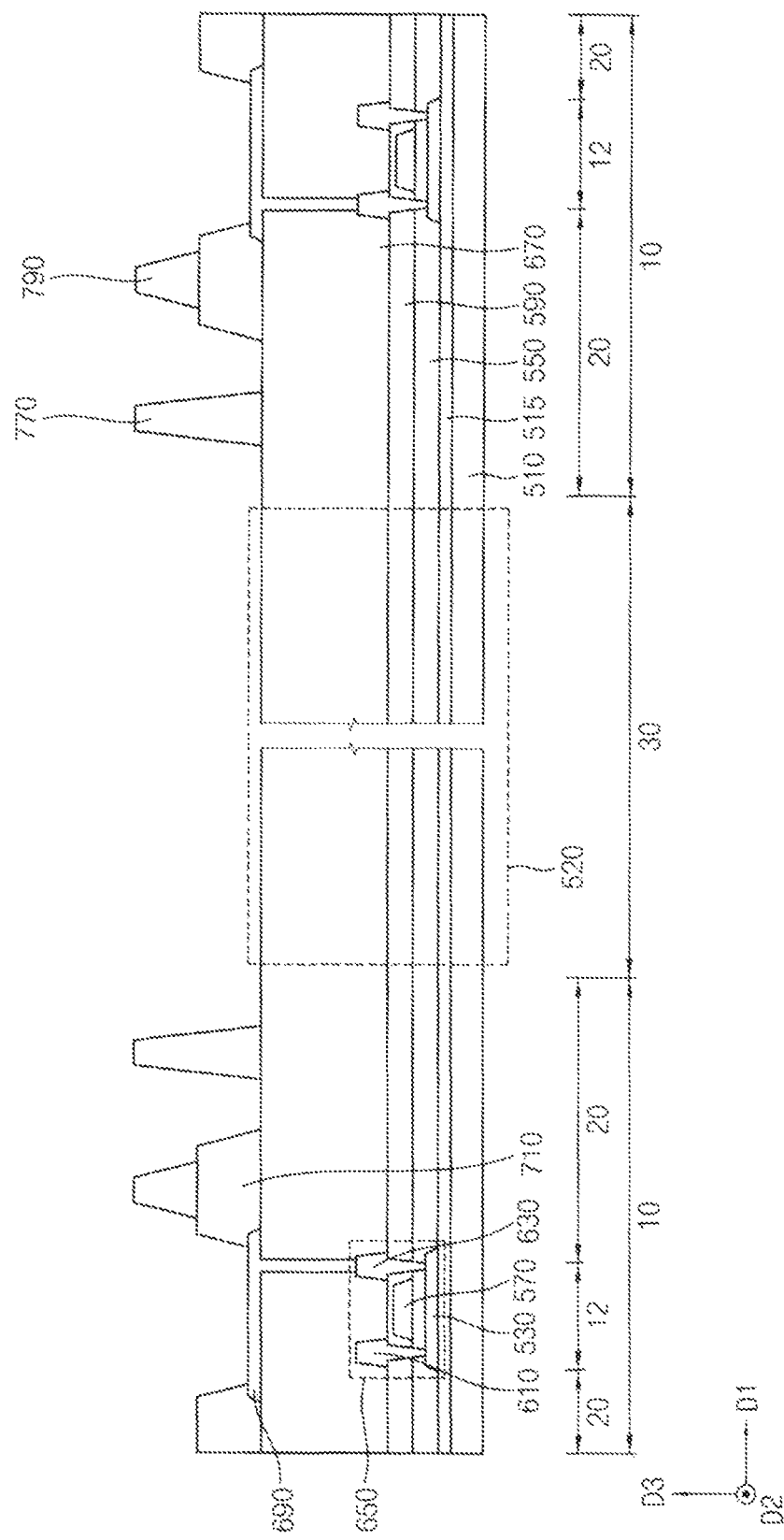
Figure 14:
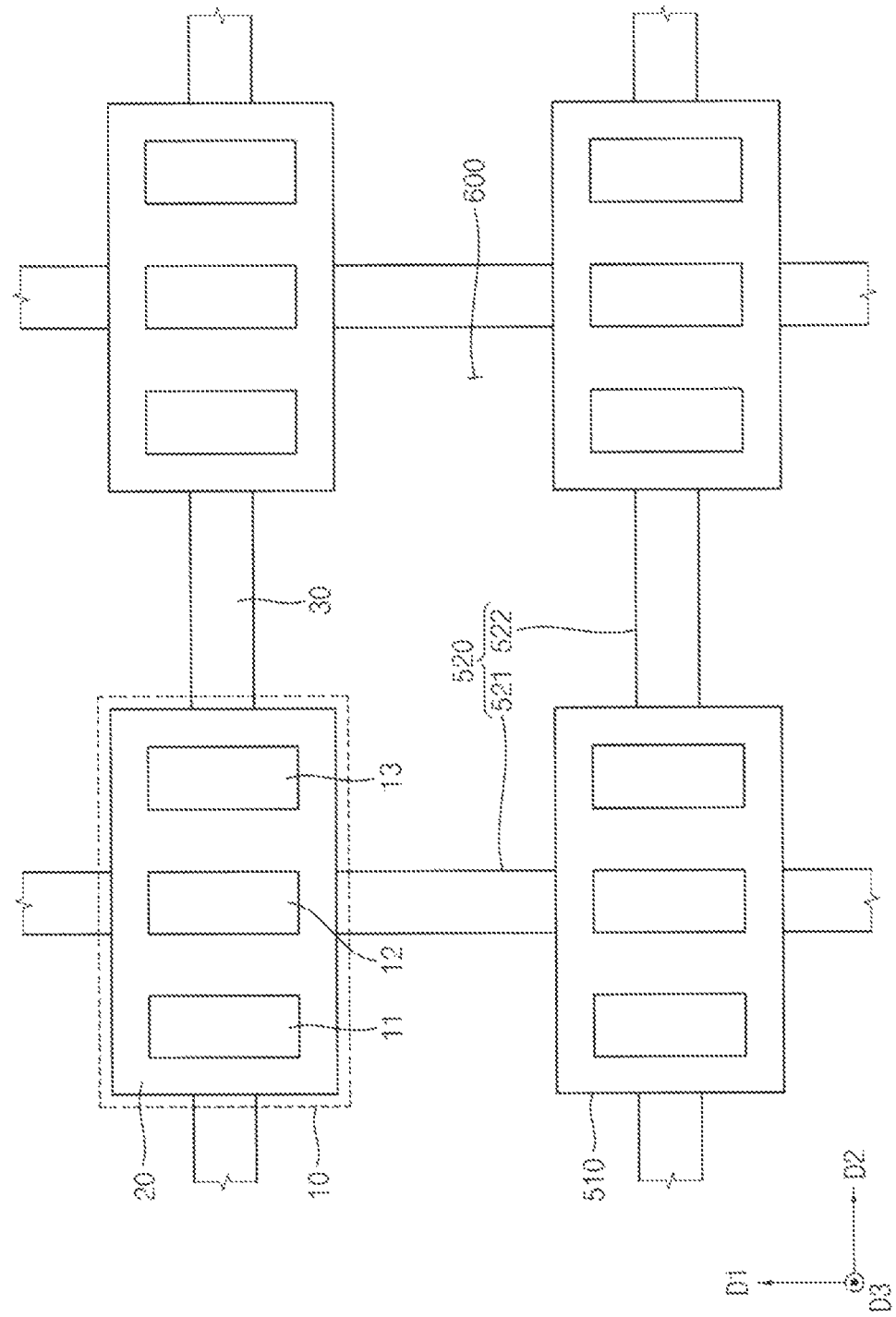

Referring to FIGS. 13 and 14, the preliminary substrate 511 may be partially removed. For example, a plurality of openings 600 may be formed in the preliminary substrate 511. After the openings 600 are formed, the substrate 510 and the connection substrate 520 may be formed. That is, the substrate 510 and the connection substrate 520 may be integrally formed. In example embodiments, a plurality of substrates 510 may be spaced apart from each other, and the connection substrate 520 may be formed between adjacent substrates 510 among the substrates 510. That is, the connection substrate 520 may include a connection region 30, and the connection region 30 may be interposed between the pixel regions 10 that are spaced apart from each other. The connection substrate 520 may have a planar shape of a bar. The connection substrate 520 may include a first connection substrate 521 and a second connection substrate 522. The first connection substrate 521 may extend in a first direction D1 that is parallel to an upper surface of the substrate 510, and may be repeatedly arranged in the first direction D1. The second connection substrate 522 may extend in a second direction D2 that is perpendicular to the first direction D1, and may be repeatedly arranged in the second direction D2. For example, a first side of the substrate 510 (e.g., side walls of the substrate 510 which are parallel to the second direction D2) may be in contact with the first connection substrate 521, a second side of the substrate 510 (e.g., side walls of the substrate 510 which are parallel to the first direction D1) may be in contact with the second connection substrate 522. The connection substrate 520 may consist essentially of materials having elasticity (or flexibility). Accordingly, when the substrates 510 are irregularly arranged, a shape of the connection substrates 520 each may be changed such that the irregular arrangements of the substrates 510 are maintained. For example, the connection substrate 520 may be stretched, bent, or folded. In this case, a shape of the opening 600 may be changed.

Figure 15:
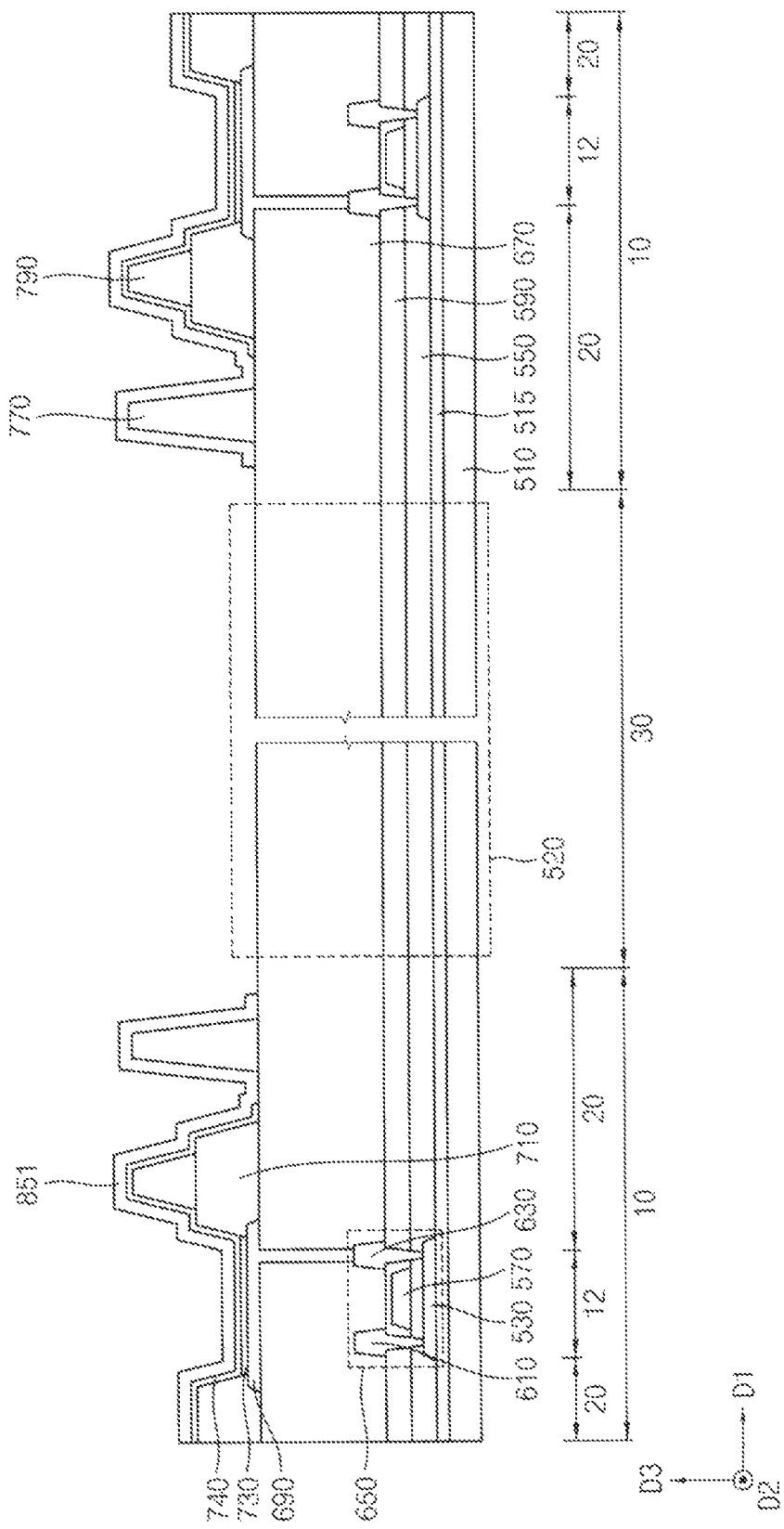

Referring to FIG. 15, a light emitting layer 730 may be formed in a portion where an upper surface of the lower electrode 290 is exposed by the pixel defining layer 710. The light emitting layer 730 may be formed using at least one of light emitting materials capable of generating different colors of light (e.g., a red color of light, a blue color of light, and a green color of light, etc) according to sub-pixels. Alternatively, the light emitting layer 730 may generally generate a white color of light by stacking a plurality of light emitting materials capable of generating different colors of light such as a red color of light, a green color of light, a blue color of light, etc. In this case, a color filter may be formed on the light emitting layer 730. The color filter may include at least one selected from a red color filter, a green color filter, and a blue color filter. Alternatively, the color filter may include a yellow color filter, a cyan color filter, and a magenta color filter. The color filter may be formed of a photosensitive resin (or color photoresist), etc.

An upper electrode 740 may be formed in the sub-pixel region 12 and a portion of the reflective region 20 on the pixel defining layer 710, the spacer 790, and the light emitting layer 730. The upper electrode 740 may be formed using a metal, a metal alloy, metal nitride, conductive metal oxide, transparent conductive materials, etc. Alternatively, the upper electrode 740 may have a multilayer structure. Accordingly, a sub-pixel structure including the lower electrode 690, the light emitting layer 730, and the upper electrode 740 may be formed.

A first TFE layer 851 may be formed in the pixel region 10 on the upper electrode 740 and the block structure 770. For example, the first TFE layer 851 may cover the upper electrode 740 and the block structure 770, and may be formed as a substantially uniform thickness along a profile of the upper electrode 740 and the block structure 770. The first TFE layer 851 may prevent the sub-pixel structure from being deteriorated by the permeation of moisture, water, oxygen, etc. In addition, the first TFE layer 851 may protect the sub-pixel structure from external impacts. The first TFE layer 851 may be formed using inorganic materials.

Figure 16:
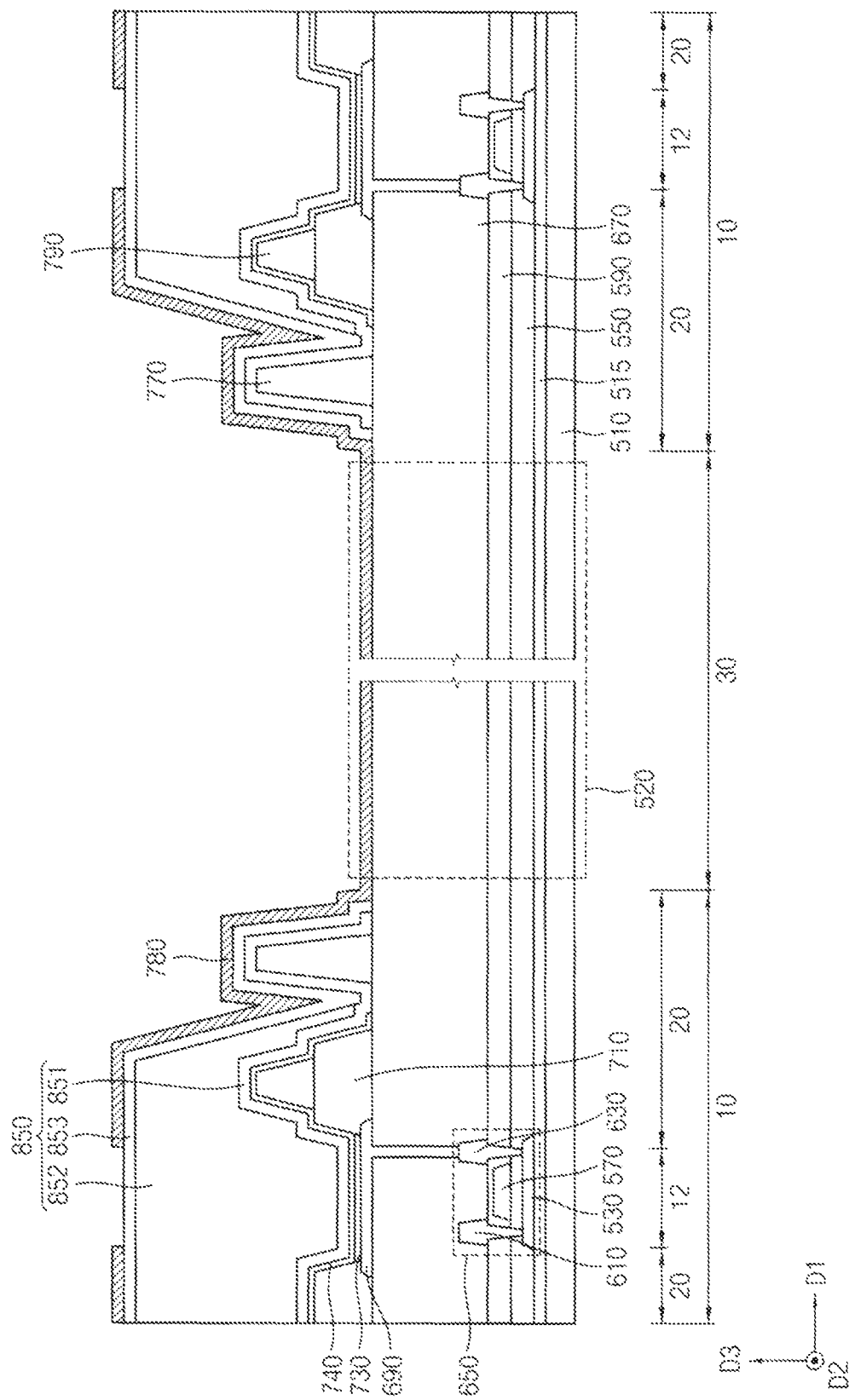

Referring to FIG. 16, a second TFE layer 852 may be formed on the first TFE layer 851. The second TFE layer 852 may improve the flatness of an OLED device, and may protect the sub-pixel structure formed in the sub-pixel region 12. The second TFE layer 852 may be formed using organic materials.

A third TFE layer 853 may be formed on the second TFE layer 852 and the first TFE layer 851. The third TFE layer 853 may cover the second TFE layer 852 and the first TFE layer 851, and may be formed as a substantially uniform thickness along a profile of the second TFE layer 852 and the first TFE layer 851. The third TFE layer 853 together with the first TFE layer 851 and the second TFE layer 852 may prevent the sub-pixel structure from being deteriorated by the permeation of moisture, water, oxygen, etc. In addition, the third TFE layer 853 together with the first TFE layer 851 and the second TFE layer 852 may protect the sub-pixel structure from external impacts. The third TFE layer 853 may be formed using inorganic materials. Accordingly, a TFE structure 850 including the first TFE layer 851, the second TFE layer 852, and the third TFE layer 853 may be formed.

A reflection pattern 780 may be formed on the TFE structure 850 and the planarization layer 670. That is, the reflection pattern 780 may be entirely formed in the pixel region 10 and the connection region 30 on the substrate 510 and the connection substrate 520. The reflection pattern 780 may expose the sub-pixel region 12. The reflection pattern 780 may be formed using a metal, a metal alloy, metal nitride, conductive metal oxide, transparent conductive materials, etc. For example, the reflection pattern 780 may be formed of Au, Ag, Al, Pt, Ni, Ti, Pd, Mg, Ca, Li, Cr, Ta, W, Cu, Mo, Sc, Nd, Ir, an alloy of aluminum, AlNx, an alloy of silver, WNx, an alloy of copper, an alloy of molybdenum, TiNx, CrNx, TaNx, SRO, ZnOx, ITO, SnOx, InOx, GaOx, IZO, etc. These may be used alone or in a suitable combination thereof. Alternatively, the reflection pattern 780 may be formed as a multilayer structure. Accordingly, an OLED device 100 illustrated in FIG. 5A may be manufactured.

Figure 17:
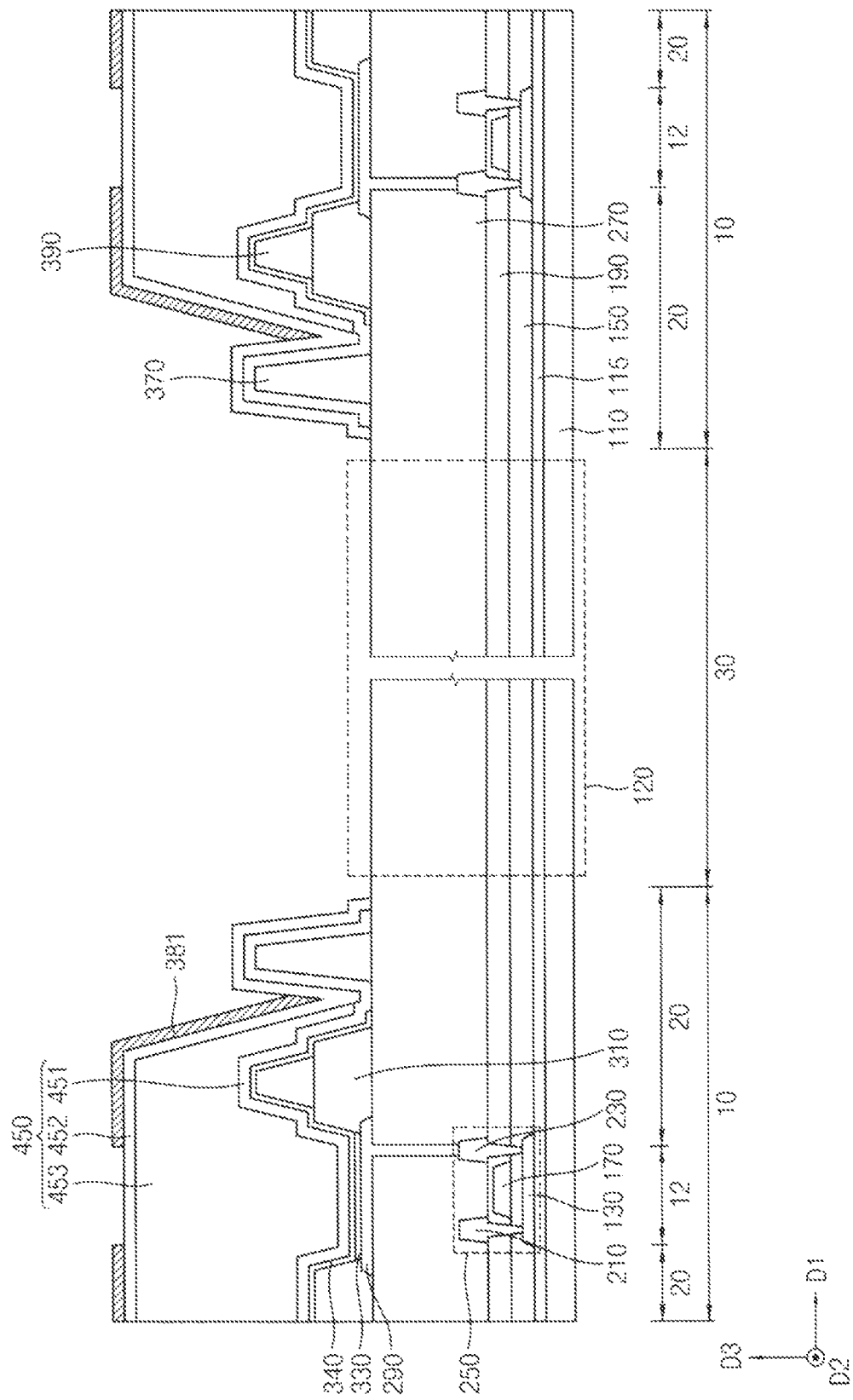
FIG. 17 is a cross-sectional view illustrating an OLED device in accordance with example embodiments.

FIG. 17 is a cross-sectional view illustrating an OLED device in accordance with example embodiments. An OLED device illustrated in FIG. 17 may have a configuration substantially the same as or similar to that of a display device 100 described with reference to FIGS. 1, 2, 3, 4, 5A, and 6 except a reflection pattern 381. In FIG. 17, detailed descriptions for elements, which are substantially the same as or similar to the elements described with reference to FIGS. 1, 2, 3, 4, 5A, and 6, will be omitted.

Referring to FIGS. 1, 2, 3, 4, 5A, 6, and 17, an OLED device may include a substrate 110, a connection substrate 120, a buffer layer 115, a semiconductor element 250, a planarization layer 270, a sub-pixel structure, a pixel defining layer 310, a spacer 390, a block structure 370, a TFE structure 450, a reflection pattern 381, etc. Here, the semiconductor element 250 may include an active layer 130, a gate insulation layer 150, a gate electrode 170, an insulating interlayer 190, a source electrode 210, and a drain electrode 230, and the sub-pixel structure may include a lower electrode 290, a light emitting layer 330, and an upper electrode 340. In addition, the TFE structure 450 may include a first TFE layer 451, a second TFE layer 452, and a third TFE layer 453.

The reflection pattern 381 may be disposed on the TFE structure 450. That is, the reflection pattern 381 may be disposed in a portion of the substrate 110, and may expose the connection substrate 120 and the block structure 370. In addition, the reflection pattern 381 may expose the sub-pixel region 12. When the reflection pattern 381 is not disposed on the connection substrate 120, elasticity of the connection substrate 120 may be relatively increased. For example, when a shape of the connection substrates 120 each is changed to maintain the irregular arrangements of the substrates 110, the connection substrate 120 may be relatively readily stretched, bent, or folded.

Figure 18:
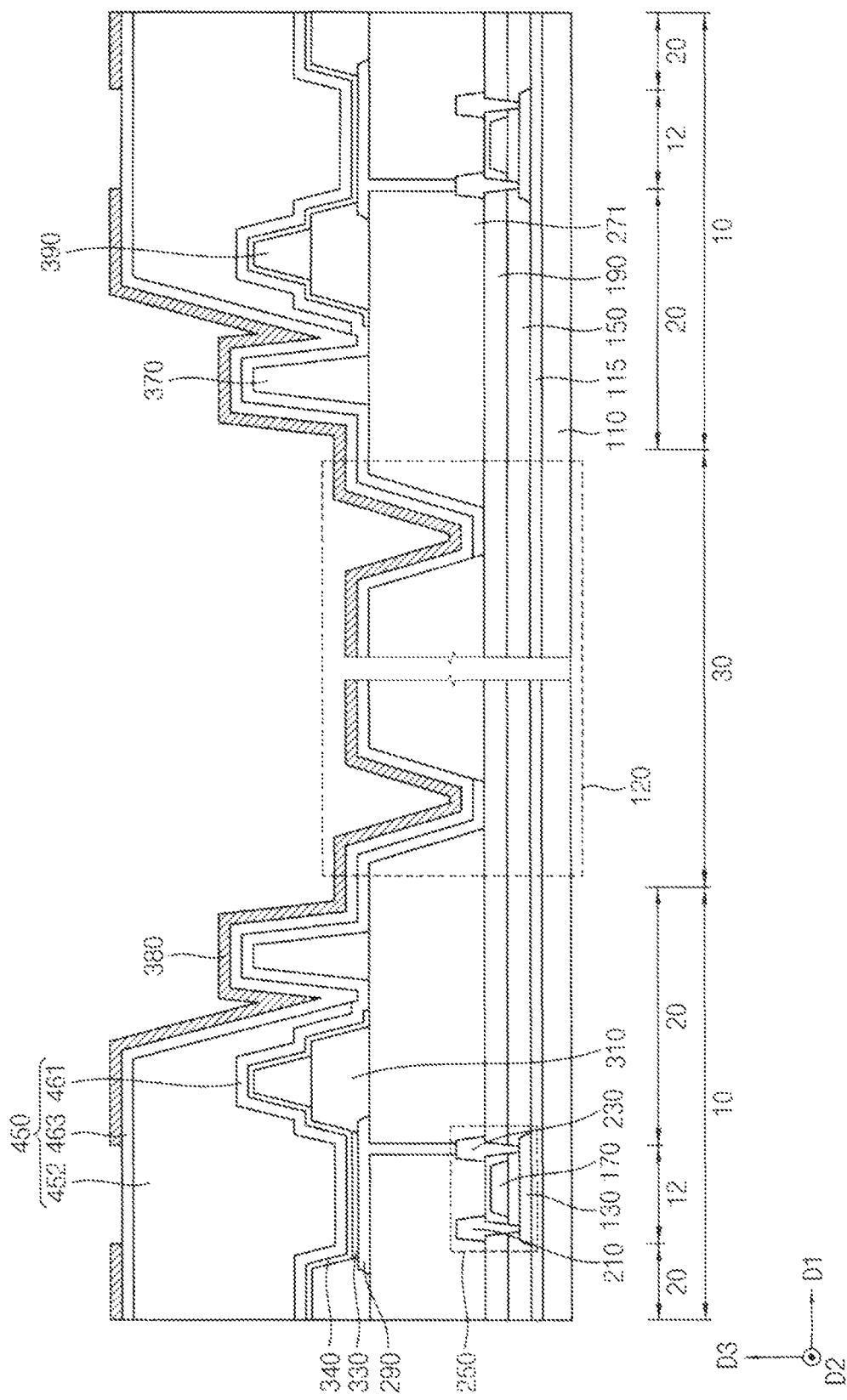
FIG. 18 is a cross-sectional view illustrating an OLED device in accordance with example embodiments.
Figure 19:
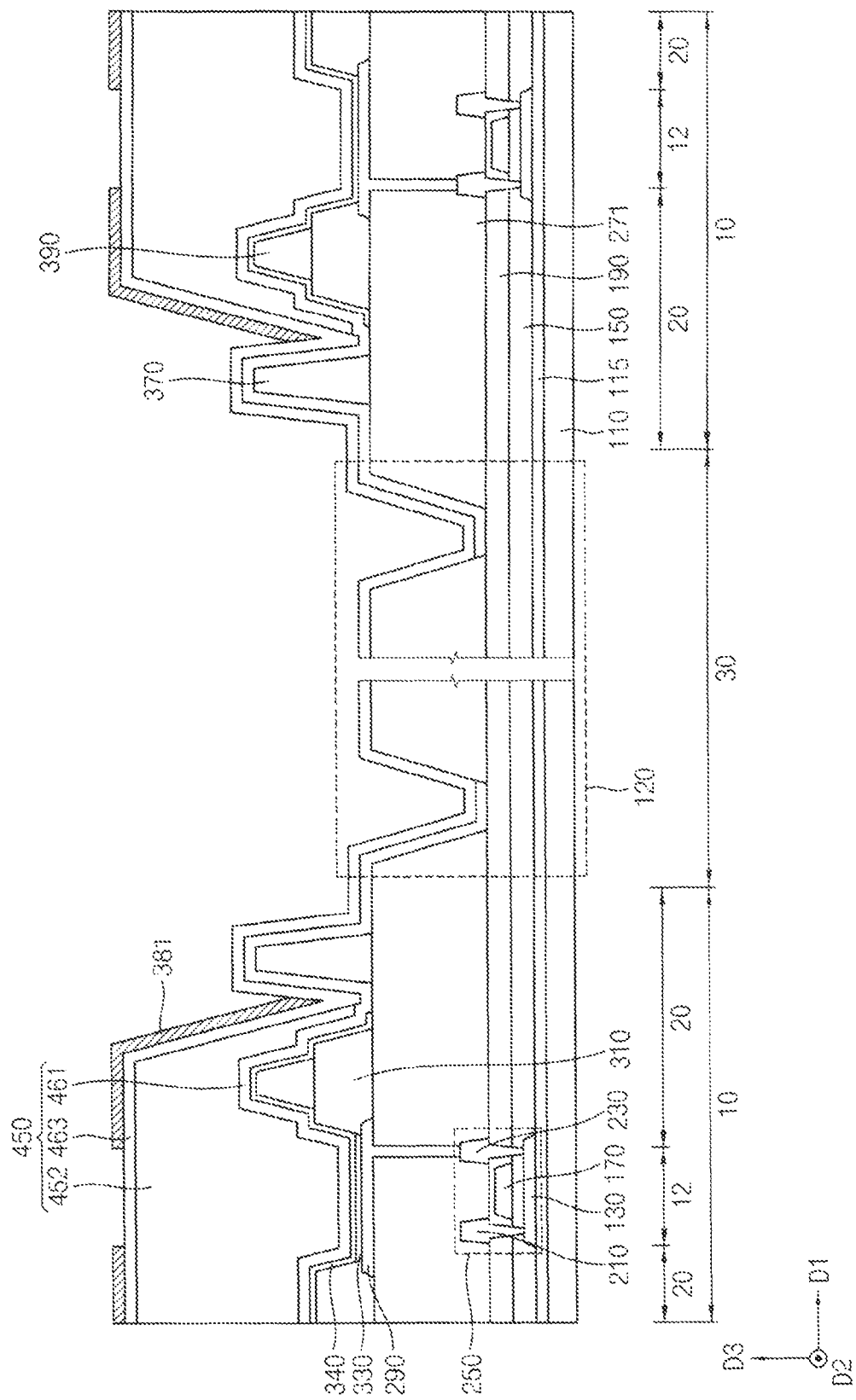
FIG. 19 is a cross-sectional view illustrating an OLED device in accordance with example embodiments.

FIG. 18 is a cross-sectional view illustrating an OLED device in accordance with example embodiments, and FIG. 19 is a cross-sectional view illustrating an OLED device in accordance with example embodiments. OLED devices illustrated in FIGS. 18 and 19 may have a configuration substantially the same as or similar to that of a display device 100 described with reference to FIGS. 1, 2, 3, 4, 5A, and 6 except a planarization layer 271, a first TFE layer 461, a third TFE layer 463, and a reflection pattern 381. In FIGS. 18 and 19, detailed descriptions for elements, which are substantially the same as or similar to the elements described with reference to FIGS. 1, 2, 3, 4, 5A, and 6, will be omitted.

Referring to FIGS. 1, 2, 3, 4, 5A, 6, and 18, an OLED device may include a substrate 110, a connection substrate 120, a buffer layer 115, a semiconductor element 250, a planarization layer 271, a sub-pixel structure, a pixel defining layer 310, a spacer 390, a block structure 370, a TFE structure 450, a reflection pattern 381, etc. Here, the semiconductor element 250 may include an active layer 130, a gate insulation layer 150, a gate electrode 170, an insulating interlayer 190, a source electrode 210, and a drain electrode 230, and the sub-pixel structure may include a lower electrode 290, a light emitting layer 330, and an upper electrode 340. In addition, the TFE structure 450 may include a first TFE layer 461, a second TFE layer 452, and a third TFE layer 463. The planarization layer 271 may be disposed on the insulating interlayer 190, the source electrode 210, and the drain electrode 230. The planarization layer 271 may cover the source electrode 210 and the drain electrode 230 in the sub-pixel region 12 on the substrate 110, and may be disposed on the entire substrate 110 and a portion of the connection substrate 120. In example embodiments, the planarization layer 271 may have an opening that exposes a portion of an upper surface of the insulating interlayer 190 disposed on the connection substrate 120 in an outer portion of the connection substrate 120. The first TFE layer 461 and the third TFE layer 463 may be disposed in the opening. In this case, the structure may block moisture or water that is permeated into the sub-pixel structure via the connection substrate 120. In addition, as the opening is formed in the planarization layer 271, the connection substrate 120 may be relatively readily stretched, bent, or folded.

As illustrated in FIG. 19, when the reflection pattern 381 is not disposed on the connection substrate 120, elasticity of the connection substrate 120 may be relatively increased.

Figure 20:
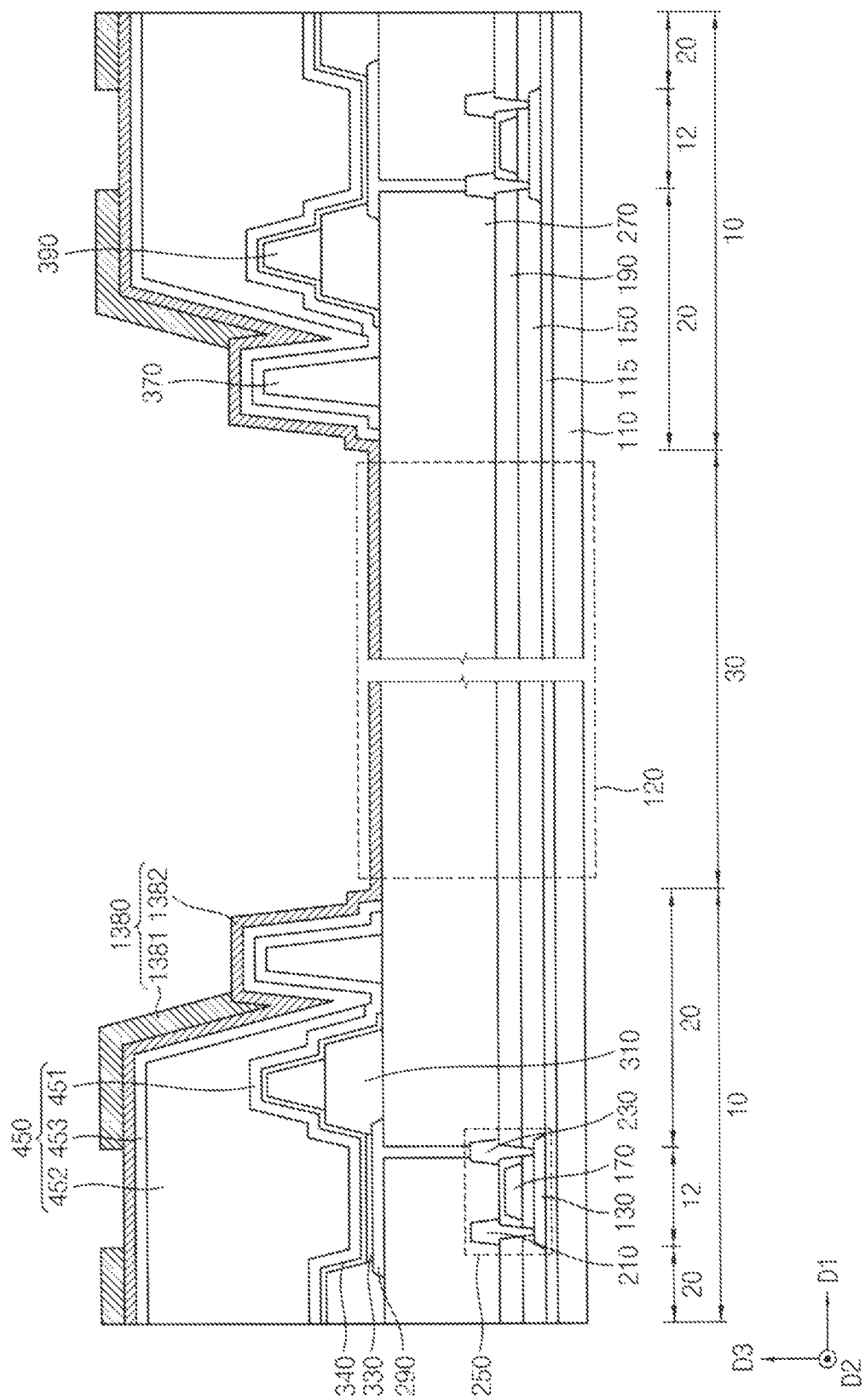
FIG. 20 is a cross-sectional view illustrating an OLED device in accordance with example embodiments.

FIG. 20 is a cross-sectional view illustrating an OLED device in accordance with example embodiments. An OLED device illustrated in FIG. 20 may have a configuration substantially the same as or similar to that of a display device 100 described with reference to FIGS. 1, 2, 3, 4, 5A, and 6 except a reflection pattern 1380. In FIG. 20, detailed descriptions for elements, which are substantially the same as or similar to the elements described with reference to FIGS. 1, 2, 3, 4, 5A, and 6, will be omitted.

Referring to FIGS. 1, 2, 3, 4, 5A, 6, and 20, an OLED device may include a substrate 110, a connection substrate 120, a buffer layer 115, a semiconductor element 250, a planarization layer 270, a sub-pixel structure, a pixel defining layer 310, a spacer 390, a block structure 370, a TFE structure 450, a reflection pattern 1380, etc. Here, the semiconductor element 250 may include an active layer 130, a gate insulation layer 150, a gate electrode 170, an insulating interlayer 190, a source electrode 210, and a drain electrode 230, and the sub-pixel structure may include a lower electrode 290, a light emitting layer 330, and an upper electrode 340. In addition, the TFE structure 450 may include a first TFE layer 451, a second TFE layer 452, and a third TFE layer 453. Further, the reflection pattern 1380 may include a first reflection pattern 1381 and a second reflection pattern 1382.

The first reflection pattern 1381 may be disposed in the reflective region 20 on the TFE structure 450. The first reflection pattern 1381 may expose the connection substrate 120 and the sub-pixel region 12 of the substrate 110, may have a first thickness. The first reflection pattern 1381 may have a plurality of openings (e.g., openings located in the sub-pixel region 12). The openings each may be corresponding to (or overlap) the sub-pixel region 12. An upper surface of the first reflection pattern 1381 may reflect a light incident from the outside (e.g., an image of an object that is located in the front of the OLED device may be disposed in the upper surface of the first reflection pattern 1381), and a light emitted from the light emitting layer 330 of the OLED device may travel via the opening located in the sub-pixel region 12. The first reflection pattern 1381 may have materials that have relatively high reflective index. For example, the first reflection pattern 1381 may be formed of Au, Ag, Al, Pt, Ni, Ti, etc. Alternatively, the first reflection pattern 1381 may include a metal, a metal alloy, metal nitride, conductive metal oxide, transparent conductive materials, etc.

The second reflection pattern 1382 may be disposed between the first reflection pattern 1381 and the TFE structure 450. The second reflection pattern 1382 may be entirely disposed on the substrate 110 and the connection substrate 120, and may have a second thickness that is less than the first thickness. That is, the second reflection pattern 1382 may be disposed in the sub-pixel region 12. The second reflection pattern 1382 may partially transmit and partially reflect a light (e.g., the second reflection pattern 1382 may transmit a portion of a light and may reflect a remaining portion of the light). For example, since a thickness of the second reflection pattern 1382 is less than that of the first reflection pattern 1381, a light transmissivity of the second reflection pattern 1382 may be greater than that of the first reflection pattern 1381. In addition, the second reflection pattern 1382 may be disposed between the TFE structure 450 and the first reflection pattern 1381 to prevent a diffraction phenomenon of light capable of being generated from the first reflection pattern 1381 having a plurality of openings. Accordingly, the OLED device may serve as a mirror display device that visibility of the OLED device is improved. For example, the second reflection pattern 1382 may be formed of Au, Ag, Al, Pt, Ni, Ti, etc. Alternatively, the second reflection pattern 1382 may include a metal, a metal alloy, metal nitride, conductive metal oxide, transparent conductive materials, etc.

Figure 22:
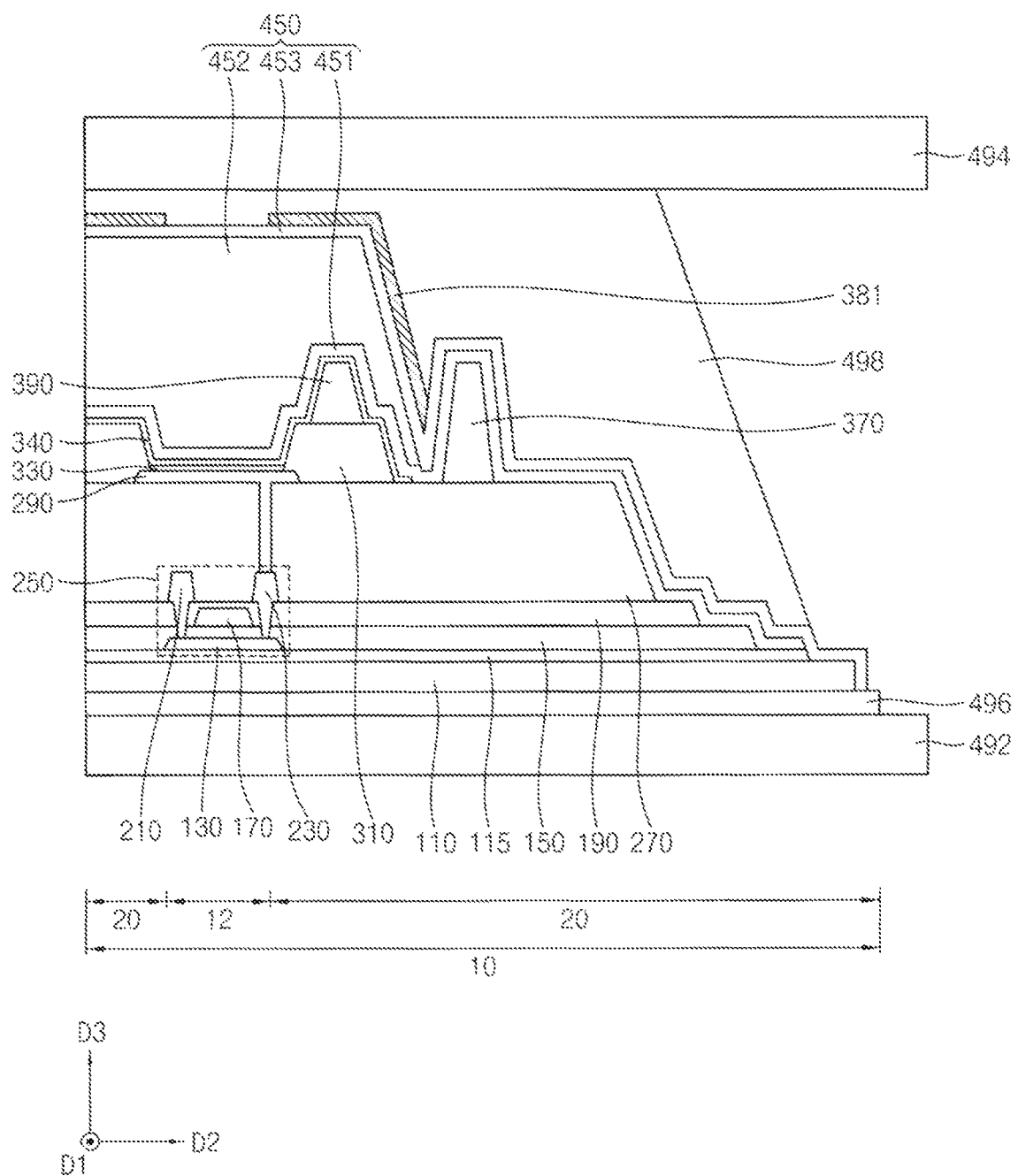
FIG. 22 is a cross-sectional view illustrating an OLED device in accordance with example embodiments.

FIG. 21 is a cross-sectional view illustrating an OLED device in accordance with example embodiments, and FIG. 22 is a cross-sectional view illustrating an OLED device in accordance with example embodiments. OLED devices illustrated in FIGS. 21 and 22 may have a configuration substantially the same as or similar to that of a display device 100 described with reference to FIGS. 1, 2, 3, 4, 5A, and 6 except a first flexible film 492, a second flexible film 494, a first adhesion layer 496, a second adhesion layer 498, and reflection patterns 380 and 381. In FIGS. 21 and 22, detailed descriptions for elements, which are substantially the same as or similar to the elements described with reference to FIGS. 1, 2, 3, 4, 5A, and 6, will be omitted.

Referring to FIGS. 1, 2, 3, 4, 5A, 6, and 21, an OLED device may include a substrate 110, a connection substrate 120, a buffer layer 115, a semiconductor element 250, a planarization layer 270, a sub-pixel structure, a pixel defining layer 310, a spacer 390, a block structure 370, a TFE structure 450, a reflection pattern 380, a first flexible film 492, a second flexible film 494, first adhesion layer 496, second adhesion layer 498, etc. Here, the semiconductor element 250 may include an active layer 130, a gate insulation layer 150, a gate electrode 170, an insulating interlayer 190, a source electrode 210, and a drain electrode 230, and the sub-pixel structure may include a lower electrode 290, a light emitting layer 330, and an upper electrode 340. In addition, the TFE structure 450 may include a first TFE layer 451, a second TFE layer 452, and a third TFE layer 453.

The first adhesion layer 496 may be disposed in a lower surface of the substrate 110. The first adhesion layer 496 may be disposed between the substrate 110 and the first flexible film 492 such that the substrate 110 and the first flexible film 492 adhere to each other. The first adhesion layer 496 may be entirely disposed in a lower surface of the substrate 110 and a lower surface of the connection substrate 120, or may be disposed only in a lower surface of the connection substrate 120. The first adhesion layer 496 may be transparent. For example, the first adhesion layer 496 may include an optical clear adhesive (OCA), a pressure sensitive adhesive (PSA), etc.

The first flexible film 492 may be disposed in a lower surface of the first adhesion layer 496. As the first flexible film 492 is disposed, the substrate 110 and the connection substrate 120 may be protected, and elasticity of the connection substrate 120 may be increased. The first flexible film 492 may have materials having elasticity. For example, the first flexible film 492 may be formed of silicon, urethane, thermoplastic ply urethane (TPU), etc.

The second adhesion layer 498 may be disposed on the reflection pattern 380. The second adhesion layer 498 may be disposed between a display structure including first flexible film 492, the first adhesion layer 496, the substrate 110, the buffer layer 115, the semiconductor element 250, the planarization layer 270, the sub-pixel structure, the pixel defining layer 310, the spacer 390, the block structure 370, the TFE structure 450, the reflection pattern 380, etc and the second flexible film 494 such that the display structure and the second flexible film 494 adhere to each other. The second adhesion layer 498 may be entirely disposed on the substrate 110 and the connection substrate 120, or may be disposed only on the connection substrate 120. The second adhesion layer 498 and the first adhesion layer 496 may have the substantially same materials.

The second flexible film 494 may be disposed on the second adhesion layer 498. As the second flexible film 494 is disposed, the reflection pattern 380, the TFE structure 450, the sub-pixel structure, the semiconductor element 250, etc may be protected, elasticity of the connection substrate 120 may be increased. The second flexible film 494 and the first flexible film 492 may have the substantially same materials.

As illustrated in FIG. 22, the reflection pattern 381 is not disposed in the outmost of the pixel region 10, the OLED device may serve as a mirror display device that visibility of the OLED device is improved because the reflection pattern 381 is not disposed on an irregularly upper surface.

The present invention may be applied to various display devices including an organic light emitting display device. For example, the present invention may be applied to vehicle-display device, a ship-display device, an aircraft-display device, portable communication devices, display devices for display or for information transfer, a medical-display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting display (OLED) device, comprising:
    a base substrate including substrates and connecting substrates, wherein the substrates each has a pixel region, the substrates are spaced apart from each other and the pixel region includes sub-pixel regions and a discrete reflective region which completely surrounds the sub-pixel regions on all sides, and wherein the connection substrates connect adjacent substrates among the substrates to form an opening formed through the base substrate in a region surrounded by the adjacent substrates and the connection substrates;
    sub-pixel structures in the sub-pixel regions on the substrates;
    a thin film encapsulation structure on the sub-pixel structures; and
    a reflection pattern disposed in the reflective region on the thin film encapsulation structure not to overlap the opening,
    wherein the substrates and the connection substrate are located at a same level and include same materials.

2. The OLED device of claim 1, wherein the substrates and the connection substrates are integrally formed.

3. The OLED device of claim 1, wherein the reflection pattern extends from the reflective region into the sub-pixel region and is disposed in both the sub-pixel region and the reflective region, and
    wherein the reflective pattern transmits a portion of a light and reflects a remaining portion of the light.

4. The OLED device of claim 1, wherein the substrates each has an island shape, and the connection substrates each has a planar shape of a bar.

5. The OLED device of claim 1, wherein the substrates each has a discrete island shape, and the connection substrates each has a substantially U shape, a substantially S shape, or a substantially W shape when the substrates are not deformed.

6. The OLED device of claim 1, wherein the substrates and the connection substrates form a mesh structure including a plurality of openings, and each of the openings is defined by adjacent four substrates among the substrates and adjacent four connection substrates among the connection substrates.

7. The OLED device of claim 1, wherein the connection substrates include:
a first connection substrate extending in a first direction that is parallel to an upper surface of the substrates; and
a second connection substrate extending in a second direction that is perpendicular to the first direction, and
wherein a first side of each of the substrates is in contact with the first connection substrate, and a second side of the each of the substrates is in contact with the second connection substrate.

8. The OLED device of claim 1, wherein the reflection pattern is disposed on the connection substrates.

9. The OLED device of claim 1, wherein the reflection pattern is disposed in at least a portion of the connection substrates and exposes at least a portion of the connection substrates.

10. The OLED device of claim 1, wherein the reflection pattern includes:
a first reflection pattern in the reflective region on the thin film encapsulation structure, the first reflection pattern exposing the connection substrates, the first reflection pattern having a first thickness; and
a second reflection pattern interposed between the first reflection pattern and the thin film encapsulation structure, the second reflection pattern on the substrates and the connection substrates, the second reflection pattern having a second thickness that is less than the first thickness.

11. The OLED device of claim 1, wherein the thin film encapsulation structure includes:
a first thin film encapsulation layer on the sub-pixel structures;
a second thin film encapsulation layer on the first thin film encapsulation layer; and
a third thin film encapsulation layer on the second thin film encapsulation layer,
wherein the first and third thin film encapsulation layers include inorganic materials, and the second thin film encapsulation layer includes organic materials.

12. The OLED device of claim 11, further comprising:
a buffer layer interposed between each of the substrates and the sub-pixel structures,
wherein the buffer layer includes inorganic materials, and overlaps the first and third thin film encapsulation layers on an edge of the substrates, and
wherein the buffer layer is integrally formed using the same materials on the substrates and the connection substrates.

13. The OLED device of claim 1, further comprising:
a semiconductor element interposed between each of the substrates and the sub-pixel structures,
wherein the semiconductor element includes:
an active layer on the each of the substrates, the active layer having source and drain regions;
a gate insulation layer on the active layer;
a gate electrode on the gate insulation layer;
an insulating interlayer on the gate electrode; and
source and drain electrodes on the insulating interlayer, the source and drain electrodes each being in contact with the source and drain regions, respectively.

14. The OLED device of claim 13, wherein the gate insulation layer is integrally formed using the same materials on the substrates and the connection substrates, and the insulating interlayer is integrally formed using the same materials on the substrates and the connection substrates.

15. The OLED device of claim 13, further comprising:
a planarization layer interposed between the semiconductor element and the sub-pixel structures,
wherein the planarization layer is integrally formed using the same materials on the substrates and the connection substrates, and has an opening that exposes a portion of an upper surface of the insulating interlayer disposed on the connection substrates in an outer portion of the connection substrates.

16. The OLED device of claim 15, wherein each of the sub-pixel structures includes:
a lower electrode in the sub-pixel region on the planarization layer;
a light emitting layer on the lower electrode; and
an upper electrode on the light emitting layer.

17. The OLED device of claim 16, further comprising:
a pixel defining layer in the reflective region on the planarization layer, the pixel defining layer covering both lateral portions of the lower electrode, the pixel defining layer exposing a portion of the lower electrode; and
a block structure spaced apart from the pixel defining layer, the block structure being in the same level with the pixel defining layer, the block structure surrounding the pixel defining layer in an outer portion of the pixel region.

18. The OLED device of claim 17, wherein each of the connection substrates is disposed between block structures those are disposed in adjacent two substrates among the substrates.

19. The OLED device of claim 17, further comprising:
a spacer on the pixel defining layer,
wherein the pixel defining layer, the spacer, and the block structure are simultaneously formed using the same materials.

20. An OLED device comprising:
a substrate including a plurality of pixel regions and a plurality of first openings formed through the substrate, each of the plurality of pixel regions having a plurality of sub-pixel regions and a discrete reflective region completely surrounding the sub-pixel regions on all sides;
a plurality of sub-pixel structures on the substrate in the plurality of sub-pixel regions, the sub-pixel structure including a lower electrode, a light emitting layer and an upper electrode;
a thin film encapsulation structure on the plurality of sub-pixel structures; and
a reflection pattern on the thin film encapsulation structure, the reflection pattern including a plurality of second openings exposing an upper surface of the thin film encapsulation structure,
wherein the sub-pixel structures do not overlap the first openings.

* * * * *